United States Patent [19]

Müller et al.

[11] Patent Number: 4,557,596

[45] Date of Patent: Dec. 10, 1985

[54] METHOD OF SCREENING HALF-TONE PICTURE THEMES

[75] Inventors: Hans Müller, Munich; Stefan May, Herbertshausen, both of Fed. Rep. of Germany

[73] Assignee: GAO Gesellschaft fur Automation und Organisation mbH, Munich, Fed. Rep. of Germany

[21] Appl. No.: 482,333

[22] PCT Filed: Jul. 29, 1982

[86] PCT No.: PCT/DE82/00158

§ 371 Date: Mar. 30, 1983

§ 102(e) Date: Mar. 30, 1983

[87] PCT Pub. No.: WO83/00570

PCT Pub. Date: Feb. 17, 1983

[30] Foreign Application Priority Data

Jul. 30, 1981 [DE] Fed. Rep. of Germany ....... 3130182
Jul. 30, 1981 [DE] Fed. Rep. of Germany ....... 3130183

[51] Int. Cl.[4] .......................... G03B 27/02; G09F 3/02
[52] U.S. Cl. ....................................... 355/132; 283/94; 355/52; 355/71
[58] Field of Search ............... 283/72, 94; 354/109; 355/7, 52, 77, 132, 71; 428/29

[56] References Cited

U.S. PATENT DOCUMENTS 2,767,093 10/1956 Bilhoefer .
2,952,080 9/1950 Avakian et al. ................. 283/94 X
2,984,030 5/1961 Hannon ............................. 283/94
3,610,120 10/1971 Morse et al. ..................... 354/109
3,807,852 4/1974 Hoydic .............................. 355/7
4,360,548 11/1982 Skees et al. ..................... 428/29
4,459,020 7/1984 May et al. ........................ 283/94

Primary Examiner—Richard A. Wintercorn
Attorney, Agent, or Firm—Stevens, Davis, Miller & Mosher

[57] ABSTRACT

A method of screening half-tone picture themes, in which the gray tones of the half-tone picture theme are reproduced by changes in the structural width of a basic screen structure having any desired form. The assignment of a gray tone area of the half-tone picture theme to the screen structure width reproducing this gray tone area may be selectively determined. In a photographic version of the inventive method (FIG. 1), a basic screen structure 1 of any form is prepared and used to produce broadening screen structures as negative films 9,11. The same number of tone separations 20,22 is produced as negative films from the picture theme 13 to be screened, each of which tone separations reproduces a certain gray tone area of the half-tone picture theme which can be adjusted by the exposure time. Tone separations 22,20 are consecutively exposed onto a line material 24 with the broadening screen structures 9,11 respectively assigned to them, the line material then reproducing the screened picture theme in such a way that the gray tone parts determined by the tone separation are reproduced locally by the screen structure width assigned to it. There are several photographic and EDP/scanner/laser variants of this method suitable for screening half-tone picture themes, producing screened printing originals and printing data carriers with this kind of screened picture theme.

23 Claims, 30 Drawing Figures

METHOD OF SCREENING HALF-TONE PICTURE THEMES

The invention relates to a method of producing screened picture themes in which the gray tones of a half-tone picture theme are reproduced by varying a basic screen structure.

The use of security line patterns such as guilloches has been known for some time, in particular for the production of security paper, identification cards and so on, as a means of preventing imitation or falsification of such data carriers. The picture theme to be protected and the security line pattern have been used up to now as separate elements. Swiss patent No. 477 066, for example, describes an identification card in which a photograph of the card owner provided in the card is protected against manipulation by being printed over with a guilloche.

Security printing can be relatively easily and cheaply produced according to this method since the security pattern is printed over the picture theme on a large area without any additional measures being involved. However, it has proved disadvantageous that color blending occurs in the areas in which the picture theme and the security lines are superimposed, thus disturbing the continuity of the color of the line.

When the picture theme and the line pattern have a monochrome design, or the picture theme is very dark, the security lines are either impossible or very difficult to recognize in the picture theme area. This kind of protection technique is therefore only used for security printing of simple quality.

It is customary to avoid such disadvantages, in particular in the printing of bank-notes, by inserting picture themes into recesses or windows in the background guilloche. The picture themes are generally carried out in high-quality steel intaglio printing which itself offers a high degree of protection in spite of the lack of a guilloche pattern over the picture theme. However, it is disadvantageous that the area reserved for the picture theme reduces the area which may be used for the background printing, thus greatly reducing the protection against forgery and falsification provided by a guilloche background pattern when the picture theme is relatively large. The existing security guidelines (stock exchange guidelines), which require, among other things, a percentual minimum area for the guilloche background, do not allow the use of picture themes covering the entire area for security paper bound to these guidelines.

A further method for the production of identification cards has become known which avoids some of the disadvantages of the above-mentioned method in which the security pattern is printed over the picture theme. By the newer method, photographs can be protected, even in their black areas, by clearly recognizable guilloche lines (see German Auslegeschrift No. 29 07 809).

In order to make the security pattern more recognizable, this publication proposed that the photo area be provided with a security pattern before being exposed, so that after exposure the exposed areas of the picture theme are interrupted by an unexposed security pattern and thus the lines of the guilloche pattern are just as recognizable as before.

In spite of the obvious advantages of this method, it involves the disadvantage that this technique can only be used in connection with picture themes which are applied by photographic means. It is not possible to exploit its advantages for other data carriers without using photographic measures.

In accordance with a novel method it has been proposed that security line patterns be integrated into picture themes on security paper or other data carriers. The printed picture theme is overlapped by a printed line pattern, the picture theme being interrupted by a negative contour matching the line pattern, and the line pattern being printed in congruently. Depending on the embodiment, the lines of the negative contour may be just as wide as the lines of the line pattern, or else wider so that the security lines are at a small distance from the picture theme on each side and thus run through the picture theme in the form of free lines, without touching it.

This method is characterized by the fact that it does not rely on photographic techniques for the production of the data carrier, and opens up new possibilities, in particular for the production of security paper, since now even the simplest picture themes can be reproduced regardless of their size, i.e. whether they cover a large or the entire surface, and still have high quality protection and meet the stock exchange guidelines. When the usual printing techniques for security paper are used, the security lines and negative contours can be reproduced very finely, so that, when the possibilities of color technology are exploited, security paper is obtained which is very difficult to imitate or reproduce, or impossible to imitate using simple means.

Whereas the above-mentioned methods of producing data carriers ultimately use the picture theme and the security line pattern as separate elements, methods are also known in which the picture information is produced by security lines which vary in thickness. These methods are based on the use of engraved glass half-tone or distance and contact screens for screening picture information as is done in printing and reproduction technology. Various forms of screens, such as dot, cross, line and grain screens, are commercially available and customarily used, all being characterized by their simple, regular, geometric structures (dot, cross, line screens) or their statistically equidistributed, irregular structures (grain screens). The variation of these forms of screen is limited by the production possibilities.

The distance or engraved glass half-tone screens are the starting point for the production of the contact screens which are so commonly used nowadays.

The production of engraved glass half-tone screens is complicated and expensive, as the production sequence shows. One starts with two absolutely plane parallel glass plates which are coated with a layer resistant to hydrofluoric acid. The line width is then scratched into the etchproof layer with the diamond scraper of a ruling machine, and after the lines have been deep-etched with hydrofluoric acid, the layer resistant to hydrofluoric acid is removed and the deepened lines are dyed with black ink. The criss-cross effect of the screen is produced by cementing the two line screen plates together so that the engraved lines are at right angles. Since the etching of the lines may easily lead to a deviation from the intended appearance of the lines, the working results for different screens with the same screen width occasionally vary considerably; in particular, the line width can only be controlled within certain tolerances in the production of line screens. The mode of production also makes it clear that it is not possible to produce complicated screen structures such as lines which cross each other several times and intertwine or other complicated irregular screen structures. One can only produce essentially parallel sets of lines which run in one direction and do not cross each other on a glass plate.

Using the engraved glass half-tone screen as a starting point, contact screens are produced by exposing extremely finegrained half-tone emulsions at a certain distance behind a engraved glass half-tone screen and then developing them.

An unlimited number of contact screens can be produced from one engraved glass half-tone screen, which considerably reduces the producer's costs arising from the expensive and elaborate production process for the engraved glass half-tone screen. There are the same restrictions and limits on the possible screen structures for contact screens produced in this manner as for the engraved glass half-tone screen, due to the latter being used as the initial screen.

A half-tone picture theme is screened with a contact screen exhibiting a continuous gradation curve by exposing a line material having an almost digital gradation curve through the negative or positive of the half-tone image and the contact screen, the half-tone negative or positive and the contact screen lying in direct contact on the line material. The screen structure used is then reproduced in the line material by the exposure, depending on the amount of light transmitted by the half-tone negative or positive, reproducing the picture information by screen structures which grow broader or narrower.

The same result is achieved, although with more technical effort, by screening the picture theme directly with a engraved glass half-tone screen. The line material is exposed through the half-tone negative or positive of the picture theme, an appropriately selected aperture and the engraved glass half-tone screen, the intervals between the line material and the screen and between the screen and the aperture being precisely coordinated with each other.

With both types of screen, a stepless reproduction of half-tones is achieved.

Another method of producing a certain contact screen which is not based on engraved glass half-tone screens and in which the contact screen exhibits step-by-step gradation has been described in German patent No. 166 722. A photographic reproduction is produced from a black and white screen consisting of straight light and dark stripes, in such a way that during exposure the objective of the camera is displaced perpendicular to the direction of the lines one or more times to such a small degree that the new screen images only appear shifted towards the first image by part of the line width. In this way, stripes with gradual convergence are formed. The screens produced in this way, used as contact screens, provide gradual reproduction of half-tones. This method is disadvantageous, however, not only due to its mechanically very elaborate production method, but also in that only straight parallel lines can be suitably translated into graduated screens.

The use of line screens in the production of security paper is already disclosed in German patent No. 368 134. The image effect is created completely or partly by parallel or almost parallel, straight or curved lines produced by using a engraved glass half-tone screen. The lines widen continuously where the picture is increasingly toned and merge in the darkened areas. Printing plates are produced by the conventional photo printing methods from the half-tone pattern translated in this manner.

The disadvantage involved in this method is that it is subject to the limits and restrictions connected with the production of engraved glass half-tone screens. For example, only simple screen structures of parallel or almost parallel lines which may combine and form knots in the darkest areas can be produced. Complicated screen structures such as line patterns which cross each other several times and intertwine, or guilloches, which offer high-quality protection, or irregular structures of varying complexity cannot be produced in this manner. The use of contact screens does not alter this fact, since their production is also based on glass half-tone screens. The use of parallel or almost parallel lines does not offer a particularly high degree of protection due to the possibilities of forgery and falsification which still exist.

The invention is thus based on the problem of providing a method of producing a screened picture theme which is not subject to the limits which apply to the production of classical contact screens.

The solution to this problem is based on the general idea of not screening the entire gray tone area of the half-tone picture theme to be screened in one step using a classically produced contact screen, as is customary in known screening techniques (in this method the assigment of each gray tone locally present in the half-tone picture theme to the local structural width of the screen cannot be influenced, and the form of the screen is subject to the limits set on its production). Instead, the gray tone area of the half-tone picture theme to be screened is divided up into areas whose limits can be defined at will, a specific but freely definable structural width of a screen structure of any form is assigned to each or certain of these gray tone areas, and the parts of the half-tone picture theme which contain a gray tone in one of these areas is translated locally into the screen structure width assigned to this gray tone area.

In a development of the invention, the overall gray tone area of the half-tone picture theme is not divided up into areas, but rather every gray tone has a certain screen structure width assigned to it.

With reference to terminology, the term "gray tone" is considered equivalent to terms such as "gradation", "blackening" and "density" ("graytone"=log (opacity)) as used in photography and reproduction technology, and is also used to represent these terms in this context since the inventive method is not restricted to black and white themes and can be analogously used for picture themes in color as well.

The solution to the problem on which the invention is based was achieved by various photographic methods which, however, may also be transformed into a "technicalized" variant by using a scanner, an EDP system and an EDP-controlled laser. The basic traits of the invention shall be described in the following, first with reference to the photographic methods.

In the first photographic method, referred to in the following as the "single step tone method", tone separations are produced from the half-tone picture theme to be screened, each of which reproduces the parts of the half-tone picture theme which reproduce gray tones belonging to a gray tone area which can be precisely positioned on the gray tone scale by the exposure time.

Starting with a basic screen structure which may have any desired form—e.g. a complicated line pattern of crisscrossing and intertwined lines, sequences of letters, numbers or line copies of richly structured landscape scenes or, last but not least, classical screen forms—, line copies of increasing structural width, i.e. screen structures which gradually broaden, are produced either graphically or by placing a negative film of the basic screen structure on line material and selectively irradiating it, new line material being used for each irradiation process and the exposure time being increased in accordance with the desired broadening of the screen structure. The number of broadened screen structures produced in this way corresponds to the number of the tone separations of the half-tone picture theme produced before, and thus to the number of gray tone areas to be translated. The half-tone picture theme is further translated into a screened picture theme by placing a negative film of the screen structure with the greatest structural width, i.e. the greatest broadening with respect to the basic screen structure, along with a negative film of the tone separation of the half-tone picture theme with the smallest structural width (the tone separation with the smallest structural width reproduces the parts of the half-tone picture theme showing the darkest gray tones, the limit on this gray tone area being set by the exposure time during the production of the tone separations) on an unexposed line material in a contact arrangement, exposing this arrangement until complete density comes about in the areas of the line material where the arrangement consisting of the negative film of the screen structure with the greatest structural width and the negative film of the tone separation with the smallest structural width is completely permeable to light rays, so that the gray tone area of the half-tone picture theme determined by the tone separation, i.e. in this case the darkest gray tones, is reproduced by the screen with the greatest structural width in the exposed line material.

One proceeds analogously with the following screen structures with decreasing structural width and the tone separations with increasing structural width and a new line material in each case.

The obtained result is a completely screened half-tone picture theme, the various gray tones of the half-tone picture theme being present on the various line materials in a screened form. These line materials can either be copied together to yield the complete picture information and used to produce a printing plate, or each line material is used to produce a separate printing plate, so that each gray tone area of the half-tone picture theme can be printed separately in a screened form. Of course, it is also possible to copy only specific line materials together, produce a printing plate with them and use the rest of the line materials to produce separate printing plates. If the basic screen structure used is a security line pattern of guilloches, it is particularly appropriate to copy this basic screen structure additionally into one of these line materials or into the completely screened half-tone picture theme, or produce a separate printing plate of the latter so that the line pattern of the guilloche is visible and can be pursued in all parts of the picture without any interruption in the screened or printed picture theme.

Special effects can be achieved by printing the screened gray tone areas of the half-tone picture theme present on different printing plates, in different colors, so that different gray tone areas are not only reproduced by different structural widths but also by different colors. The cross-section of such a printed screen line then shows a stepped pyramid shape consisting of different color layers, the number of steps being proportional to the width of the screen line and thus to the gray tone of the half-tone picture theme in this area. The use of metallic, metameric, thermochrome or photochrome inks on the basis of this method offers completely new possibilities of increasing the protection of security paper or bank-notes against forgery and falsification.

A further advantage of this method is that any structure can be used as a basic screen structure, thus banishing the restrictions which have held up to now for the production of classical screens such as dot, line, cross or grain screens. The basic screen structure may now, for example, be parallel, almost parallel, spiral, starshaped, intersecting or intertwined line systems running zig-zag, in waves, arcs, circles or straight; guilloches, e.g. concentric guilloches; words, numbers, characters; geometric structures such as circles, ellipses, triangles, other polygons; classical screen structures such as dot, line, cross or grain screens; structural elements of a second picture theme, e.g. the line copy of a richly structured landscape motif; a screened picture theme.

It is also advantageous that the translation of a gray tone in the half-tone original into a certain screen structure width can be selectively controlled, both in terms of the number and range of the gray tone areas to be translated and the screen structure width assigned to each gray tone area. Depending on the number of the gray tone areas of the half-tone picture theme to be translated, the position and range of which can be defined at will on the gray tone scale, the gray tones can be reproduced in steps or continuously by broadening the basic screen structure in steps or continuously. It is also opportune in this connection to make use of the advantages of macrophotography. For example, when an extremely fine picture theme is to be reproduced or a very fine screen structure is used as a basic screen structure, a highly differentiated reproduction of the gray tones can be obtained by carrying out all procedural steps with enlarged negatives or positives and reducing the screened printing original to the desired size afterwards. If, for example, the gray tones of the original are to be reproduced in 50 shades, 50 screen structures which broaden in steps are produced on an enlarged scale from the basic screen structure which may consist of very fine guilloches or other fine structures. If the picture theme to be screened or the tone separations (in this case there are 50 of them) are enlarged accordingly and all procedural steps are then carried out with these enlarged structures, imprecise reproduction which may arise when working with such a large number of steps in their normal size and be due to fitting difficulties or connected with the finite grain size of the photo material and statistical fluctuations in the marginal areas of the structures, is avoided or reduced to a minimum. The advantage for the production of the screen structures should not be neglected either, since coarser structures can be produced with less effort and be better reduced in size afterwards than very fine structures which are produced in their original size from the beginning.

When working with very few steps, e.g. three, on the other hand, the optical quality of the printing original can be improved by carrying out all procedural steps with greatly reduced screen structures. The finite grain size of the photo material and the not quite step-wise gradation curve of the line material are exploited to mitigate the otherwise sharp jump between two gray tones in the screened printing original and make them more continuous. If all procedural steps are in fact carried out on a greatly reduced scale and the screened printing original is enlarged to the desired size afterwards, almost continuous transitions between the various screen structure widths reproducing the various gray tones of the half-tone picture theme to be screened, are obtained due to the effect just mentioned.

A somewhat different method of improving the optical quality of the printing original, which is suitable for any number of steps and may be used in addition to the methods described above, is to reproduce the screened picture theme, after it has been copied together but before the basic screen structure has additionally been copied in, on a line material with a certain fuzziness in a process camera. The fuzziness is adjusted in such a way that the step-by-step transitions in the screened picture theme are mitigated and made more continuous. The sharp basic screen structure is then copied in to this fuzzy reproduction of the screened picture theme.

Another photographic version of the inventive method, referred to in the following as the "single step half-tone method", avoids the production of tone separations from the half-tone picture theme to be screened, using instead a negative of the half-tone picture theme. The procedural steps of this method are completely analogous to those of the "single step tone method" except for the fact that in this case the various tone separations in the various exposure processes (tone separation - screen structure - line material) are replaced by the half-tone negative of the picture theme to be screened, the gray tone area of the half-tone picture theme to be translated into a particular screen structure width being set by the exposure time.

A further photographic version is referred to in the following as the "contact screen half-tone method", in which first a contact screen is produced and then the half-tone picture theme is screened as in the classical screening techniques. The inventive essence of this method is the production of the contact screen, since in this case it is unnecessary to produce engraved glass half-tone screens and thus the restrictions involved in their production are avoided. In this method, negative films of the screen structures which become broader step-by-step are placed consecutively on an unexposed half-tone material in a contact arrangement and exposed for a certain period of time, so that, when all exposure processes have been carried out on the gradually broadening screen structures, each screen element of the basic screen structure is reproduced by a gray tone or density curve which can be precisely set, being defined by the various exposure times. If, for example, a security line pattern consisting of a guilloche is used as a basic screen structure, the cross-section of a screen element, i.e. a line, exhibits a gray tone or density curve which is step-by-step or continuous depending on the number of the broadening screen structures. The form of this density curve can be selectively and freely controlled by varying the exposure times and the number of broadening screen structures and by the degree of broadening during their production, which is not possible in the case of classical contact screen production. Half-tone positives can be screened in the positive contact screen produced in this manner, as is customary in classical screening techniques (negative contact screens can be analogously produced by replacing the positives by negatives and vice versa). With this method, any structure at all may be reproduced in a contact screen which may serve to screen a picture theme. Particular advantages of this method are the free controllability of the gray tone or density curve in the contact screen and the absolutely free choice of the basic screen structure. The reproduction of gray tones when screening a picture theme can be set in any way one chooses by controlling the density curve in the contact screen; some gray tones may be suppressed, shifted or accentuated (it is of course also possible to control the gray tone reproduction in this way with the single step method). A further advantage of this method is its economic aspect—in contrast to the production of glass half-tone screens, which is only worthwhile if a large number of contact screens are subsequently produced from them. Furthermore, both methods, the single step and the contact screen methods, are particularly well-suited for printing security paper, since the use of original guilloches is mandatory for this purpose, but the repeated use of the same guilloche structure is not allowed.

An essential advantage, especially of the single-step method, is that only one printing original is produced since it is not necessary to prepare a contact screen which would allow for identical reproduction, and the method can only be reconstructed if the exact "recipe" (the various exposure times, structural widths of the line copies, etc.) is known. It should be pointed out as well that, in all the photographic variants, the sequence of exposure is of no importance in the screening process; a certain sequence was only selected in this description for the sake of clarity. Furthermore, the use of positive or negative films is equivalent in all variants, so that all methods may be carried out with positive or negative films. Any changes due to the specific positive or negative procedure will not be mentioned explicitly, since they are a matter of course for an expert.

The essence of the inventive method—the photographic variants have been discussed above—may also be put into practice in a "technicalized" variant, exploiting EDP, computer graphics, laser and scanner techniques.

The essential traits of such a "technicalized" variant shall be sketched in the following, a distinction being necessary between two technicalized methods: a so-called "EDP single step method" and an "EDP contrast screen method".

There are different possibilities of jumping or switching from photographic to "technicalized" variants and vice versa, so that the methods may be combined at various points. These points of intersection are not given special mention in the following, since they are clear to an average expert on the basis of the operating sequences.

The most important technical equipment for the "technicalized" methods consists of an EDP system and a terminal capable of graphics, a scanning device connected with the EDP system and a laser beam recorder controlled by the EDP system.

The first step of the technicalized methods consists in producing a basic screen structure. It can be produced either with the resources of computer graphics or by appropriate mathematical programs, the form and position of the screen elements being stored, or an original prepared graphically or photographically is scanned and the form and position of the screen elements are likewise stored.

The gradually broadening screen structures can either be produced from the basic screen structure by means of the EDP system, stored separately and displayed optically, or photographically prepared broadening screen structures are scanned and also stored separately.

The broadening screen structures produced by the EDP technique may also be translated onto a line material by an EDP-controlled laser beam recorder, by having the laser expose a line material controlled by the information on the position and form of the screen elements of the relevant screen structure.

In the "EDP single step method", "electronic tone separations" are produced from the half-tone picture theme to be screened, dividing the entire gray tone range of the half-tone original into freely definable gray tone areas according to their position and range, and scanning the half-tone original separately for each gray tone area in such a way that the parts of the half-tone picture theme having a gray tone in the relevant gray tone area are stored according to their position and form. Using the EDP system, each gray tone area is assigned a broadened screen structure, and the stored information on the parts of the half-tone picture theme in the relevant gray tone area and the information on the assigned screen structure into which this gray tone area is to be translated, are "superimposed" in such a way that resulting information is stored for every point at which a screen structure part and a picture theme part are present. This resulting information reproduces the parts of the picture theme in the selected gray tone area, which have been translated into the relevant screen structure, and can be displaced optically on the display screen or transferred onto a line material by the EDP-controlled laser. This method is carried out analogously for each gray tone area and for each screen structure assigned to it. The information which comes about in these "electronic" screening processes and which is stored separately for each gray tone area, may also be overlaid, stored and displayed optically on the display screen, so that one gains an impression of the overall picture theme screened. The completely screened picture theme can also be transferred onto a single line material by the laser controlled with this information. Of course, it is also possible to transfer the screened picture theme directly by aid of the EDP-controlled laser either onto a printing plate, or the singly screened gray tone areas onto different printing plates.

In the "EDP contact screen method", first of all a so-called "electronic contact screen" is produced. This is done, for example, by assigning a gray tone to each broadened screen structure produced as described above, adding this gray tone information to the information on the position and form of the screen elements of the relevant screen structure, superimposing all information on the broadening screen structures with the assigned gray tones in such a way that resulting information is formed which assigns a certain gray tone to each point in the screen structure. Thus an "electronic contact screen" is obtained having a gray tone pattern which may be precisely set and is defined by the form of the basic screen structure, the number of broadening screen structures and the gray tones assigned to the latter.

A further variant in producing an "electronic contact screen" consists in producing a basic screen structure as described above, and defining a gray tone pattern for a characteristic screen element by means of computer graphics, for example by defining and optically displaying the gray tone as a function of the position coordinates (x,y) of a characteristic screen element of the basic screen structure. If this information is transferred onto the entire basic structure, an "electronic contact screen" is likewise obtained.

This information may in turn be used to control a laser which exposes the screen structure and the predefined gray tone progression onto an unexposed half-tone material. This contact screen present in the forl of a half-tone material can then be used as in classical screening techniques.

It is also possible to screen a half-tone picture theme directly, avoiding the production of a photographic contact screen. If, for example, the half-tone original to be screened is scanned in such a way that the gray tone present at each point of the half-tone picture theme is stored, and this information is overlaid with the stored "electronic contact screen" in such a way that the gray tones are added for each point of the half-tone original and the electronic contact screen, storing resulting information when a certain, empirically determined gray tone threshold is exceeded during this addition, a completely screened picture theme is obtained via this resulting information which may be optically displayed and transferred by a laser beam recorder onto a line material or directly onto a printing plate.

It must finally be pointed out with reference to the "technicalized" methods that they are extremely variable in the production of screen structures and gray tone patterns due to the use of an EDP system capable of graphics and a scanner, and allow for immediate translation of a half-tone picture theme into any screen structure one chooses, as well as for the optical display of this screening on the display screen. This is of considerable value when trying out new screen forms, since, apart from the other advantages, much time is saved relative to the classical methods. In the following, the invention shall be described in more detail with reference to the figures listed below.

FIG. 1, a schematic view of the procedural sequence of the "single step tone method"

FIG. 2 a basic screen structure positive (schematic)
FIG. 3 a basic screen structure negative (schematic)
FIG. 4a first broadened screen structure positive
FIG. 4b second broadened screen structure positive
FIG. 5a first broadened screen structure negative
FIG. 5b second broadened screen structure negative
FIG. 6 half-tone picture theme to be screened
FIG. 7a first tone separation negative
FIG. 7b second tone separation negative
FIG. 8a first screen result positive
FIG. 8b second screen result positive
FIG. 9 screened picture theme
FIG. 10 screen structure width as a function of the gray tone of the half-tone original
FIG. 11 exposure arrangement for "single step half-tone method"
FIG. 12 picture theme to be screened
FIG. 13 broadened screen structure positive
FIG. 14 tone separations
FIG. 15 screening results, single steps
FIG. 16 screened picture theme
FIG. 17 basic screen structure guilloches
FIG. 18 screened picture theme
FIGS. 19a, 19b, and 19c characteristic crossing line guilloches
FIG. 20 "contact screen half-tone method"
FIG. 21 exposure arrangement for the production of the contact screen
FIG. 22 gray tone pattern in the step contact screen FIG. 23 step-by-step approximation of a continuous gray tone pattern in the contact screen FIG. 24 gray tone pattern in the contact screen after fuzzy exposure FIG. 1 shows a schematic plan of sequence for the "single step tone method" or the "EDP single step method", the various steps being described in more detail with reference to the following FIGS. 2 to 9. In order to make these methods clearer, FIGS. 2 to 9 contain extremely schematic views and show only the steps necessary to explain the methods. Below, the method will be described again briefly with more realistic screen structures on the basis of FIGS. 12 to 18, in order to convey somewhat of an impression of the possibilities of application.

It may also be observed that the photographic version of the method is always explained first, and then the "technicalized" variant is sketched, the procedural sequence of which is essentially analogous to that of the photographic version. Any points of intersection, i.e. between the photographic and "technicalized" variants, are generally only mentioned in passing or not explicitly mentioned, since these points of intersection may basically exist between all procedural steps and are thus obvious.

The left-hand branch of the sequence plan in FIG. 1 shows the production of broadening screen structures from one basic screen structure or original screen structure. A negative film 3 (FIG. 3) is produced from a positive 1 of the basic screen structure—FIG. 2 shows a positive 1 of such a very schematic basic screen structure which is symbolized by seven stripes 2 of a definite structural width, the stripes 2 being completely opaque.

Broadening screen structures 5,7 are produced as line copies (two, in this case) from this negative 3 by placing the negative 3 on an unexposed line material and obtaining a broadening of the stripes by selective control of the exposure, i.e. selective irradiation.

Figure 1:
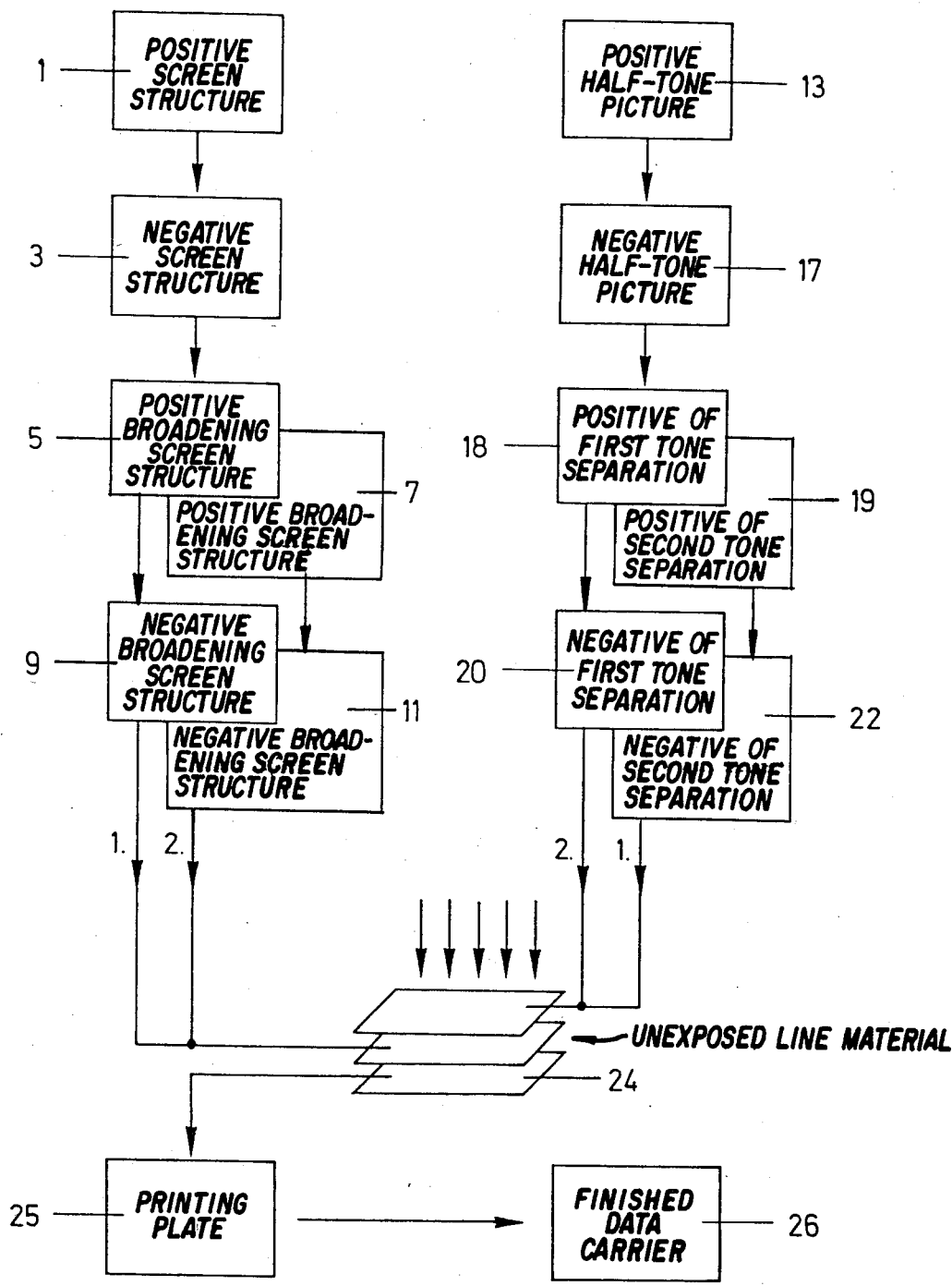
Figure 5A:
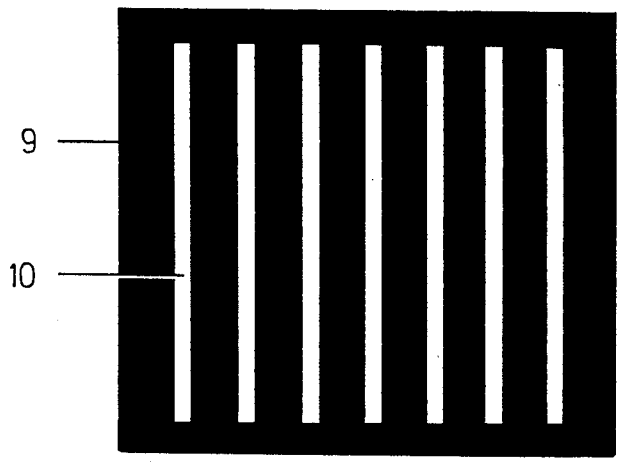
Figure 5B:
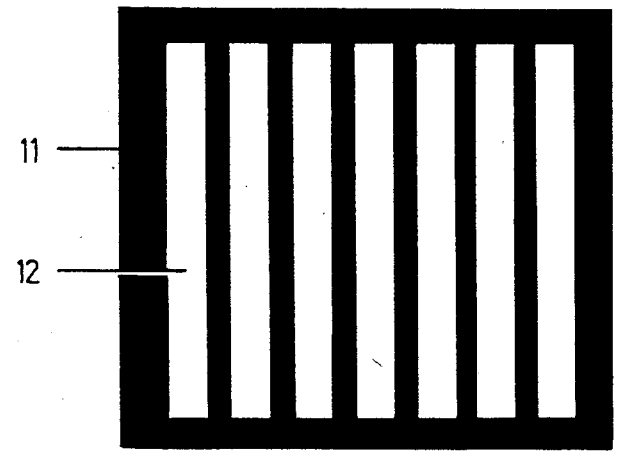

The next procedural step in FIG. 1 consists in producing negatives 9,11 (shown in FIGS. 5a and 5b) from these line copies of increasing structural width present in the form of positive film 5,7.

The right-hand branch in FIG. 1 shows the preparation of the half-tone picture theme 13 to be screened.

Figure 6:
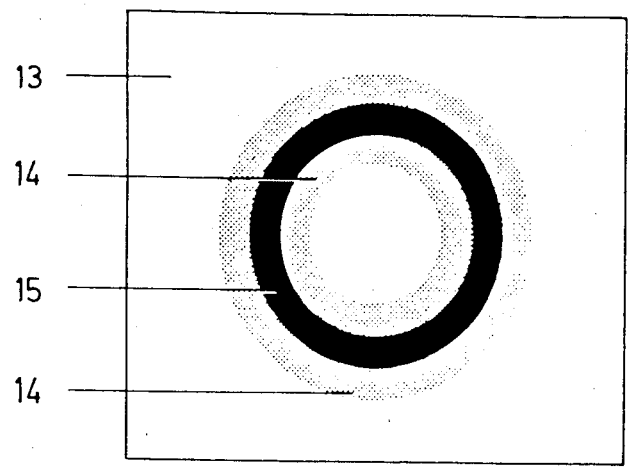

FIG. 6 shows a positive 13 of the picture theme to be screened, a circular ring with two different shades of gray 14 and 15, representing any continuous gray tone pattern of the half-tone picture theme to be screened.

This positive 13 of the half-tone picture theme (FIG. 1) is used to produce a negative film 17 from which tone separations present in the form of positive film 18,19 are then prepared by placing the half-tone negative 17 on a new unexposed line material for each tone separation and exposing it for a certain period of time. The duration of the exposure depends on what gray tone is to be separated from the half-tone picture theme. In this example, the exposure time for the first tone separation is selected so that the black circular ring 15 in FIG. 6 is separated, i.e. the tone separation with the smallest structural width reproduces the darkest area of the halftone picture theme.

All gray tones of the picture theme starting with white and proceeding to a certain suitably selected gray tone are integrated to white, and the remaining gray tones are integrated to black, the transition in this case (the first tone separation) being selected in such a way that it lies exactly between the gray tones of circular rings 15 and 14 (FIG. 6).

For the second tone separation, the exposure time is increased so that not only circular ring 15 (FIG. 1) but also the next gray tone area, circular rings 14, are separated, i.e. a greater gray tone area of the half-tone picture theme is reproduced altogether by this second tone separation.

Figure 7A:
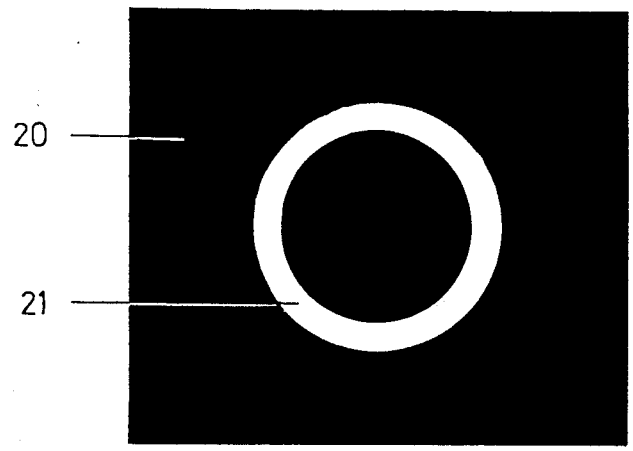
Figure 7B:
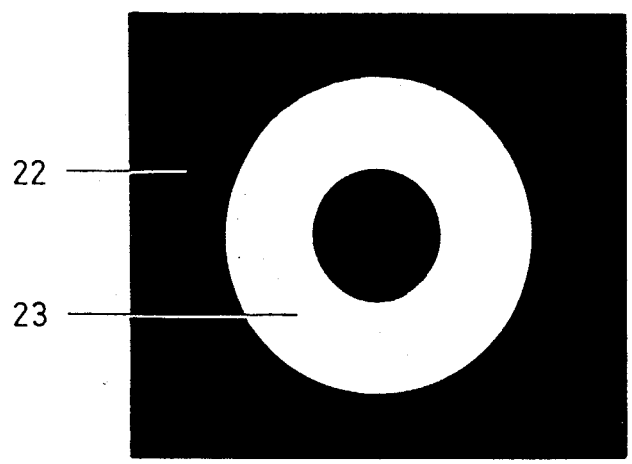

Negative films 20,22 (FIG. 1) are produced, which are shown in FIGS. 7a and 7b, from these tone separations which are present in the form of positive film 18,19 (FIG. 1).

FIG. 7a shows the negative of the first tone separation with the smallest structural width, i.e. the darkest separated area of the half-tone picture theme, in this case ring 21, which corresponds to ring 15 in FIG. 6.

FIG. 7b shows the negative 22 of the second tone separation of increasing structural width 23, i.e. the larger separated gray tone area determined by the exposure time, which in this case consists of rings 14,15 of FIG. 6.

The procedural steps up to now have determined which gray tones or gray tone areas of the half-tone picture theme are to be translated into which increased structural width of the basic screen structure. The actual translation process is shown at the bottom of FIG. 1 with the union of the left-hand branch with the right-hand branch. The line copy 9 with the smallest structural width, present in the form of a negative film, is placed along with the tone separation 22 with the greatest structural width, also present in the form of a negative film, on an unexposed line material 24 in a contact arrangement. This arrangement is exposed until complete blackening has occurred in the areas of the line material where the arrangement is completely pervious to light, so that the gray tone area of the half-tone picture theme determined by tone separation 22 (ring 23 in FIG. 7b) is reproduced by the screen with the smallest structural width.

Figure 8A:
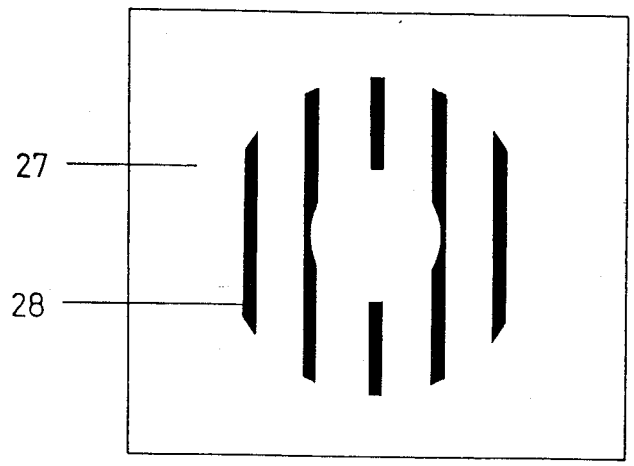

The result of this exposure process is shown in FIG. 8a. The positive 27 of the line material 24 exposed above reproduces the broadened screen structure 28 in the areas where the tone separation 22 transmits the light completely, i.e. in the area of ring 23 in FIG. 7b.

One proceeds analogously with the second tone separation 20 (FIG. 7a) with the smaller structural width and the line copy 11 (FIG. 5b) of smaller structural width assigned to this tone separation, and a new, unexposed line material.

Figure 8B:
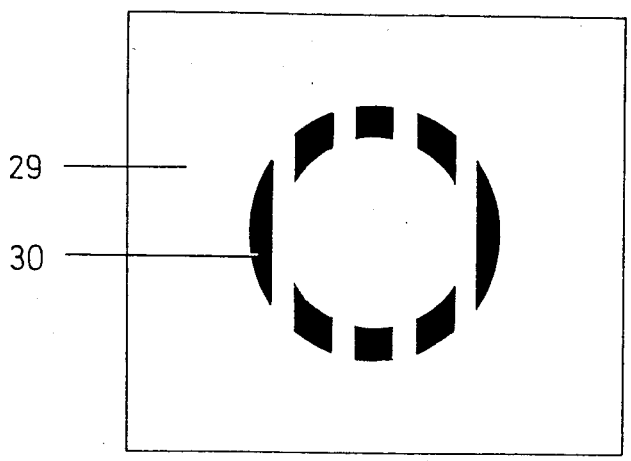

The result of this second exposure process is shown in FIG. 8b. The two exposed and developed line materials can then be copied together to form the full screened picture information.

Figure 9:
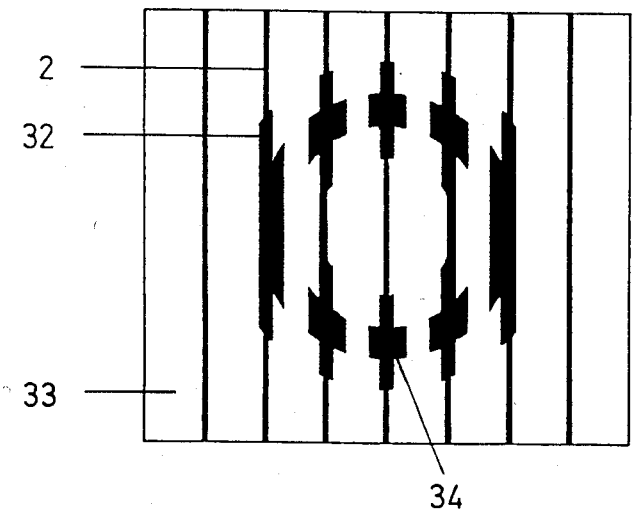

FIG. 9 shows the completely screened picture theme as positive 33, whereby the basic screen structure or original screen structure 2 (in FIG. 2) has been copied in additionally. The darkest gray tone area of the half-tone picture theme 13 to be screened (FIG. 6) is reproduced locally by the screen structure 34 which broadens most greatly; the lighter areas are reproduced by the screen structure with the smaller structural width 32. It is particularly advantageous to copy in basic screen structure 2 when guilloches are used as a basic screen structure, since then the path of the lines can be pursued without interruption in all parts of the picture, which counts as an important security feature in the printing of security paper.

The screened parts (FIGS. 8a and 8b) of the picture theme may be used to produce printing plates 25 (FIG. 1). A separate printing plate maybe prepared for each part (FIGS. 8a and 8b), for example by means of the known contact copying techniques, so that the individually screened gray tone areas of the half-tone picture theme are present on different printing plates and are printed separately (the basic screen structure may be copied into one of the parts beforehand, or an additional printing plate is prepared for the basic screen structure). Alternatively, the entire screened picture theme of FIG. 9 is transferred onto one printing plate and printed all at once with known techniques used in security paper printing, such as simultaneous printing, etc. Optical effects which may be achieved by bleeding techniques, etc., as used in security paper printing, are also possible, as well as colors which are impossible or very difficult to separate by reproduction techniques.

If several printing plates are used to reproduce the different gray tone areas, they may help to produce special color effects which are also interesting in terms of security, if each printing plate bears a different color and they are all printed fitting exactly on top of each other, yielding a stepped-pyramid-shaped cross-section of the line depending on the structural width of the screen structure, in the finished data carrier 26 (FIG. 1), this cross-section of the line consisting of different layers of ink. The use of metallic, metameric, thermochrome or photochrome inks for one or more of these ink layers provides a particularly valuable security feature, since it is introduced selectively into the structure of the picture and forms part of the picture information, so to speak.

The possibilities in terms of printing techniques mentioned here also apply to all the methods described in the following, so that they will not be specially mentioned again.

Figure 10:
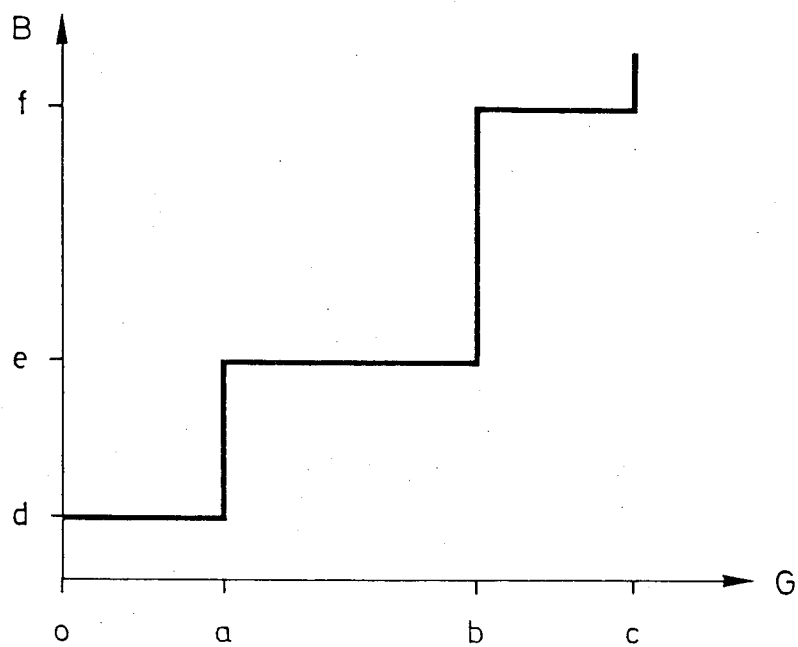

The translation of the continuous gray tone pattern of a half-tone original into a gradually broadening screen structure will now be described in more detail with reference to FIG. 10. The diagram should be interpreted in such a way that the continuous gray tone scale depicted on axis G is translated into certain structural widths B of the screen structure, i.e. the diagram shows the structural width B as a function of the gray tone G of the half-tone original. All gray tones from 0 to value a are reproduced by the copied-in original screen structural width d, values a to b by width e and values b to c by width f. Assuming a half-tone negative of the picture theme with a continuous gray tone pattern, slight statistical fluctuations in the incidence of light might lead at point a, for example, to irregular, uncontrollable fluctuations between the two screen widths e and d, which could diminish the quality of the optical appearance of the screened picture theme. Using the tone separations, one is now in a position to set the limits to which the gray tones of the original are integrated to black, in such a way that one stays just below the jump between screen widths d and e and these fluctuation phenomena become irrelevant. Of course, it is also possible with these methods to choose any setting of the limits at will, and thus exactly control the gray tone reproduction by a certain structural width or broadening of the basic screen structure. One can also work with any number of screen steps which can be produced within the technical possibilities, and obtain a quasi-continuous or continuous pattern. The particular advantage of this method is that one has freely selectable independent parameters which can be coordinated with each other exactly and controllably for each procedural step.

Before dealing in more detail with the "EDP single step tone method", corresponding to the "single step tone method", some other photographic variants of the single step method shall be briefly described. Instead of carrying out the exposure processes on each new line material 24 with the pairs consisting of a line copy of the screen and a tone separation assigned to it, as described above, it is also possible to carry out all exposure processes on the same line material 24 so that it is not necessary to copy the various screened parts together.

Furthermore, the sequence of exposure processes is also irrelevant, which is true of all photographic methods.

A further photographic variant is the "single step halftone method", which is basically carried out in the same manner as the "single step tone method". In contrast to the latter, however, no tone separations are prepared from the picture theme to be screened, since the negative film 17 of the half-tone picture theme is used instead of tone separations 18, 19 or 20, 22 (FIG. 1). The gray tone area to be translated from the half-tone picture theme into each structural width assigned to it is determined by the exposure time during the exposure process with gradually broadening screen structures 9,11. Dark gray tones of the half-tone positive to be screened are translated by short exposure times, and light gray tones by longer exposure times into the broadened screen structure assigned to each area. In the above example, line copy 9 (FIG. 5a) with the smallest structural width is thus placed on an unexposed line material 24 in a contact arrangement along with the half-tone negative 17 of the picture theme to be screened, and exposed until the dark gray tones of the half-tone positive are reproduced by the screen structure width of the line copy 9, the limit of this gray tone area being selectively determinable by the duration of exposure. One proceeds analogously with the following line copy 11 (FIG. 5b) of increasing structural width and the same half-tone negative 17, except that the exposure time is increased in accordance with the gray tone area to be translated.

Figure 11:
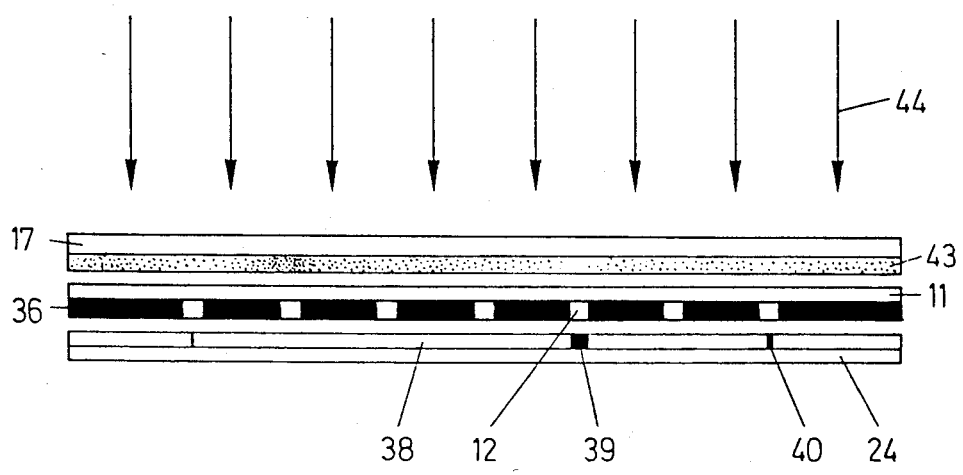

FIG. 11 shows the schematic exposure arrangement for the "single step half-tone method", whereby in the example shown here, all exposure processes are carried out on the same line material and the exposure times must be selected in this case somewhat differently than in the case of the "single step half-tone method", in which a new line material is used for each broadened screen structure. Half-tone negative 17 of the picture theme to be screened, with its various gray tones reproducing the picture information in photo emulsion layer 43, is placed on a line material in contact with a line copy of the broadened screen structure present in the form of negative film 11 and completely pervious to light in the area of screen structure 12, and then exposed for a predefined length of time with parallel light 44. This exposure process on the line material is repeated with every broadened screen structure. Depending on the incidence of light, the line material is blackened in the area of screen window 12. In this case, the exposure process is shown, for example, with the second broadened screen structure of FIG. 5b. Enough light falls through screen window 12 in area 39 to cause complete blackening, while the quantity of light in area 40 is just enough to cause the area which was exposed with the smallest screen structure width in the first exposure process but not yet blackened, to exceed the almost digital gradation threshold of the line material and effect blackening, due to the cumulative effect of the incidence of light in the photosensitive layer of the line material. The blackening extends over the area left open by the two screens, i.e. in this case only over the screen width of the narrowest screen; the area left open additionally by the second screen is not yet blackened since the entire quantity of light did not yet suffice for this purpose. If further broadening screen structures were used, this exposure process would be carried out analogously with each broadened screen structure, whereby each exposure time could be precisely set in order to obtain the desired half-tone translation of the picture theme into narrowing or broadening screen structures.

The production of printing plates and the printing of the data carrier are carried out analogously to the "single step tone method". The same procedural sequence as shown in FIG. 1 basically holds for the "EDP single step method" as well. For the sake of clarity and in order to emphasize the possible points of intersection between the photographic and "technicalized" methods, the operating sequence of this method is divided up into the following sections:

1. Production of the basic screen structure
2. Production of the broadening screen structures
3. Production of the "tone separations"
4. Screening process After each of sections 1 to 4 one can virtually "switch over" to the photographic method or jump from the photographic method to the "technicalized" method.

The technical apparatus for the "technicalized" methods consists of an EDP system with a terminal capable of graphics, a scanning device connected with the EDP system and a laser beam recorder controlled by the EDP system.

Section 1: Production of the basic screen structure
The basic screen structure may be produced by means of computer graphic techniques ("light-pen", etc.) or by special mathematical programs (e.g. if a screen structure is constructed of mathematically depictable line structures of other geometric structures such as circles, triangles, etc.). This screen structure is stored separately, so that the form and position of each screen element are clearly determined (e.g. by assigning to each point of the basic screen structure information saying whether a screen structure is present at this point or not).

This point already allows for a transition to the photographic method, since the laser beam recorder which exposes the basic screen structure onto a line material is controlled with the stored information on the form of the screen structure.

The basic screen structure can also be produced photographically or graphically, however, then scanned for the position and form of the screen elements by the scanning device connected with the EDP system, the resulting information on the basic screen structure being then stored.

2. Production of the broadening screen structures

The broadening screen structures may be produced by the EDP system from the stored basic screen structure, by defining for each broadening screen structure a "broadening factor", broadening the screen elements by this factor and storing the form of each broadening screen structure separately (point of intersection with the photographic method by transferring the broadening screen structures onto a line material by means of the EDP-controlled laser). Of course, broadening screen structures prepared photographically or graphically may also be scanned and their form information stored separately.

3. "Tone separations"

The "tone separations" are likewise obtained by the scanning device, by defining gray tone areas by EDP, scanning the half-tone picture theme for each of these gray tone areas and separately storing the parts of the half-tone picture theme containing a gray tone from one of these areas for each gray tone area, thus obtaining "electronic tone separations", as one might say (an alternative is to scan photographic tone separations and separately store this information). The advantage of the technicalized variant as far as the "electronic tone separations" are concerned is that any gray tone areas can be defined and separated quickly and without difficulty.

4. Screening process

The actual screening process takes place in such a way that a certain broadened screen structure is assigned by EDP to each or only selected gray tone areas, the "electronic tone separation" reproducing the particular gray tone parts of the half-tone picture theme is superimposed on the assigned broadened screen structure in such a way that the stored information on the "tone separation" and the assigned screen structure is compared point-by-point and when a tone part and a screen part are present at one point, resulting information is formed and stored saying that a screened picture part is present at this point. This method is carried out for each pair consisting of a gray tone area and an assigned "tone separation" and the information is stored separately for each pair, so that as a result the various gray tone areas of the half-tone picture theme reproduced by the assigned screen structure are present separately stored in a screened form and can also be shown optically on the display screen, for example.

Further, the various screened parts reproducing one of the selected gray tone areas of the half-tone picture theme can be transferred by the EDP-controlled laser onto one or more line materials or directly onto one or more printing plates. It is also possible, of course, to superimpose the various screened parts in EDP to form the completely screened picture theme, display the completed picture theme optically, additionally superimpose the screen structure and transfer any superimposition of the various screened parts by means of the EDP-controlled laser onto one or more printing plates (or else line materials).

There are practically unlimited possibilities of varying this method, since the speed of EDP allows for the screen structures, gray tone areas, degrees of broadening, superimposition of screened parts to be changed at almost any point of the method, and the results can be directly displayed so that the effect of small changes in some parameter on the final result of the screening process can be immediately observed.

An example which demonstrates the design possibilities better than the schematic sketches in FIGS. 2 to 9 is shown in FIGS. 13 to 16. For the sake of clarity, positives are used here, which of course is equivalent to the use of negatives.

Figure 12:
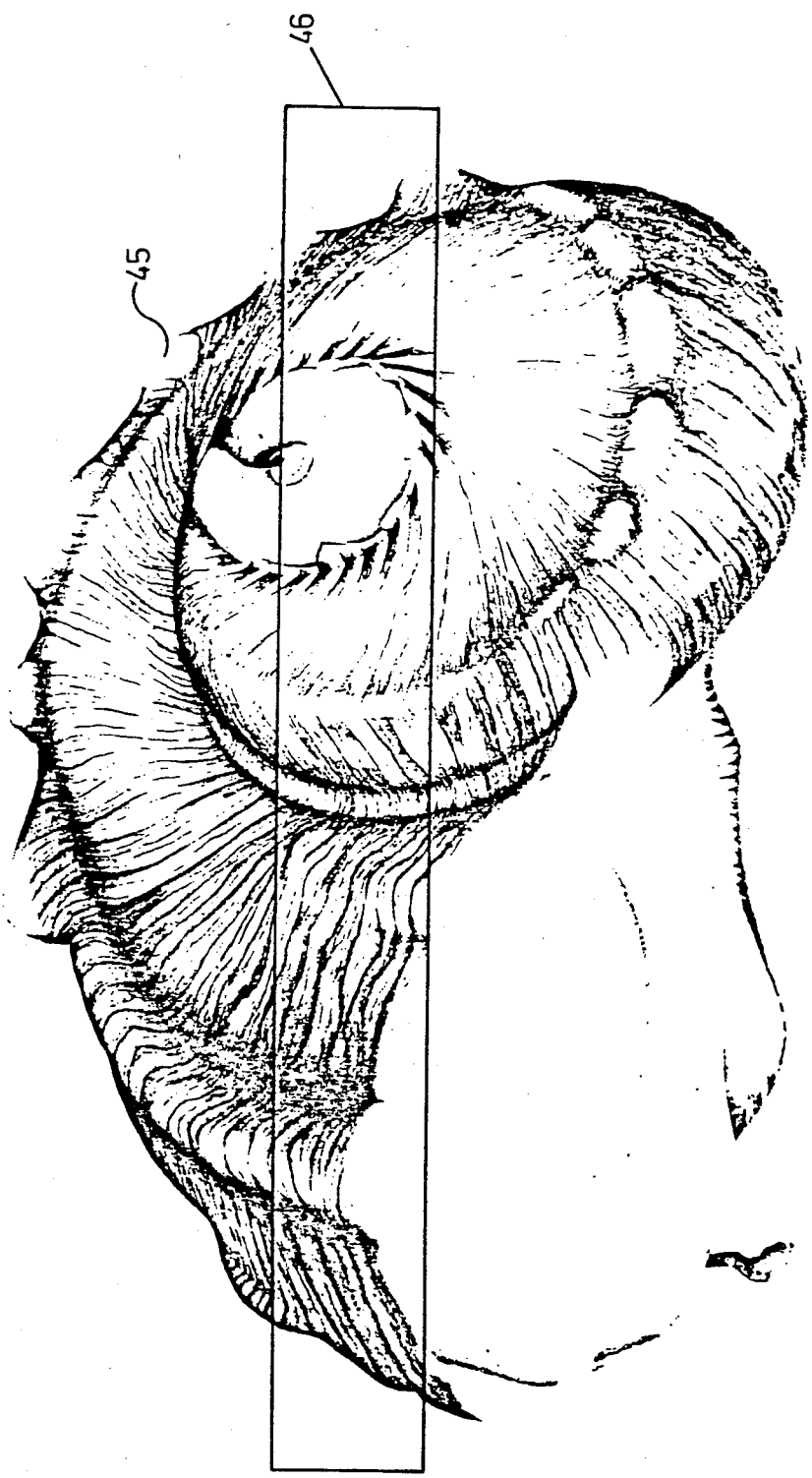

FIG. 12 shows a shell 45 as the half-tone picture theme to be screened, the following procedural steps being explained with reference to the window segment 46 marked.

Figure 13:
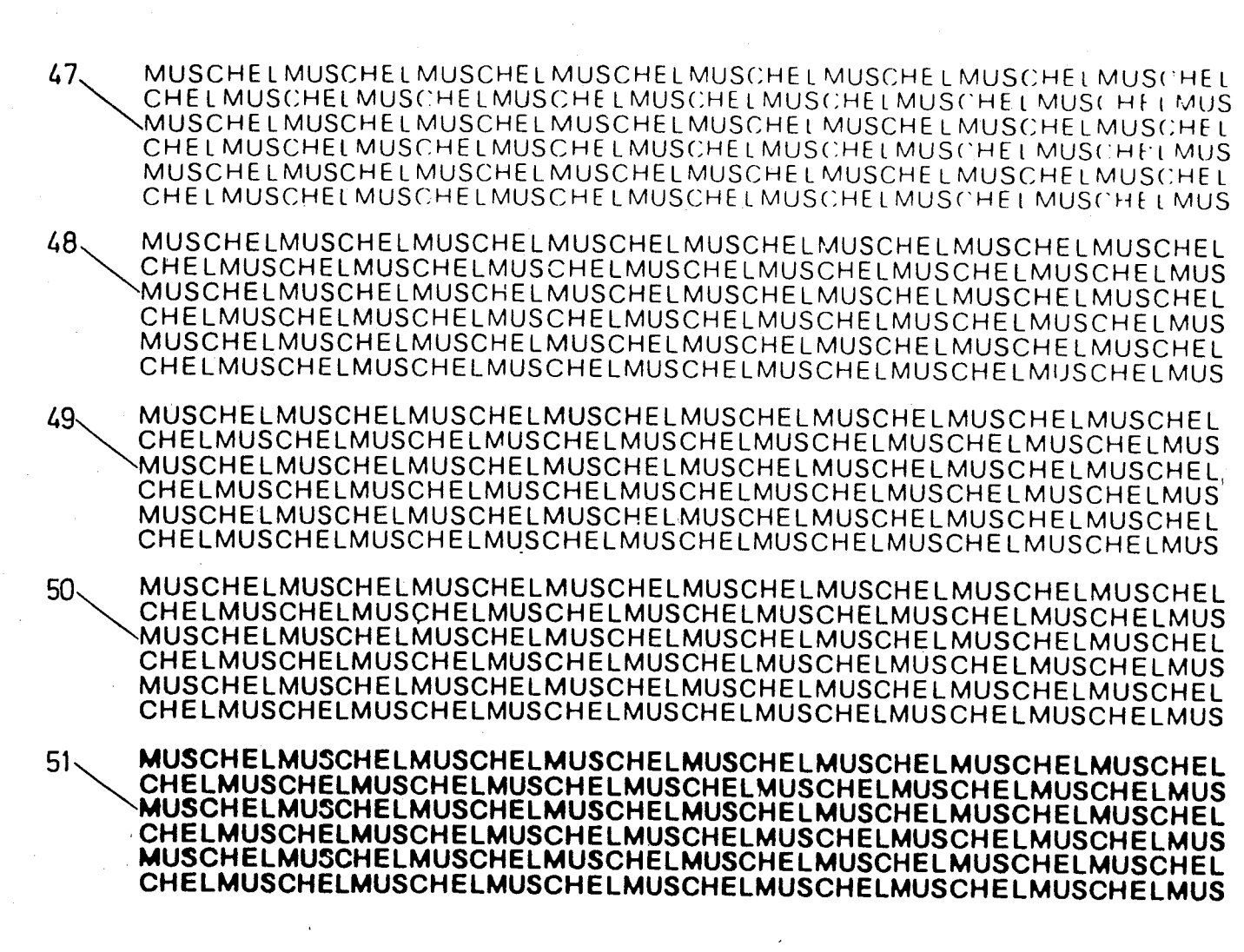

The background writing (somewhat enlarged) shown in FIG. 13 is used as a screen, stripe 47 showing the basic screen structure or original screen structure and the following stripes 48,49,50,51 each growing broader step-by-step by a certain width.

Figure 14:
Figure 14:
Figure 14:
Figure 14:
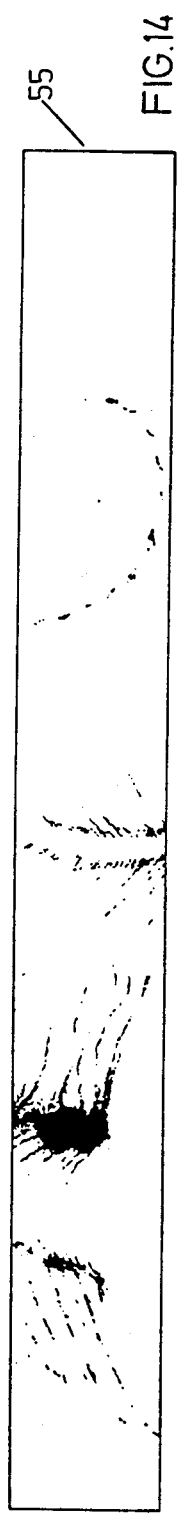

FIG. 14 shows four tone separations (52,53,54,55) of the half-tone picture theme (window segment 46 of FIG. 12) with increasing structural width.

The tone separation with the greatest structural width 52 of FIG. 14 is placed on a line material in contact with the broadened screen structure 48 with the smallest structural width (FIG. 13) and exposed until the line material is completely blackened in the area not covered by the letters or the picture theme.

Figure 15:
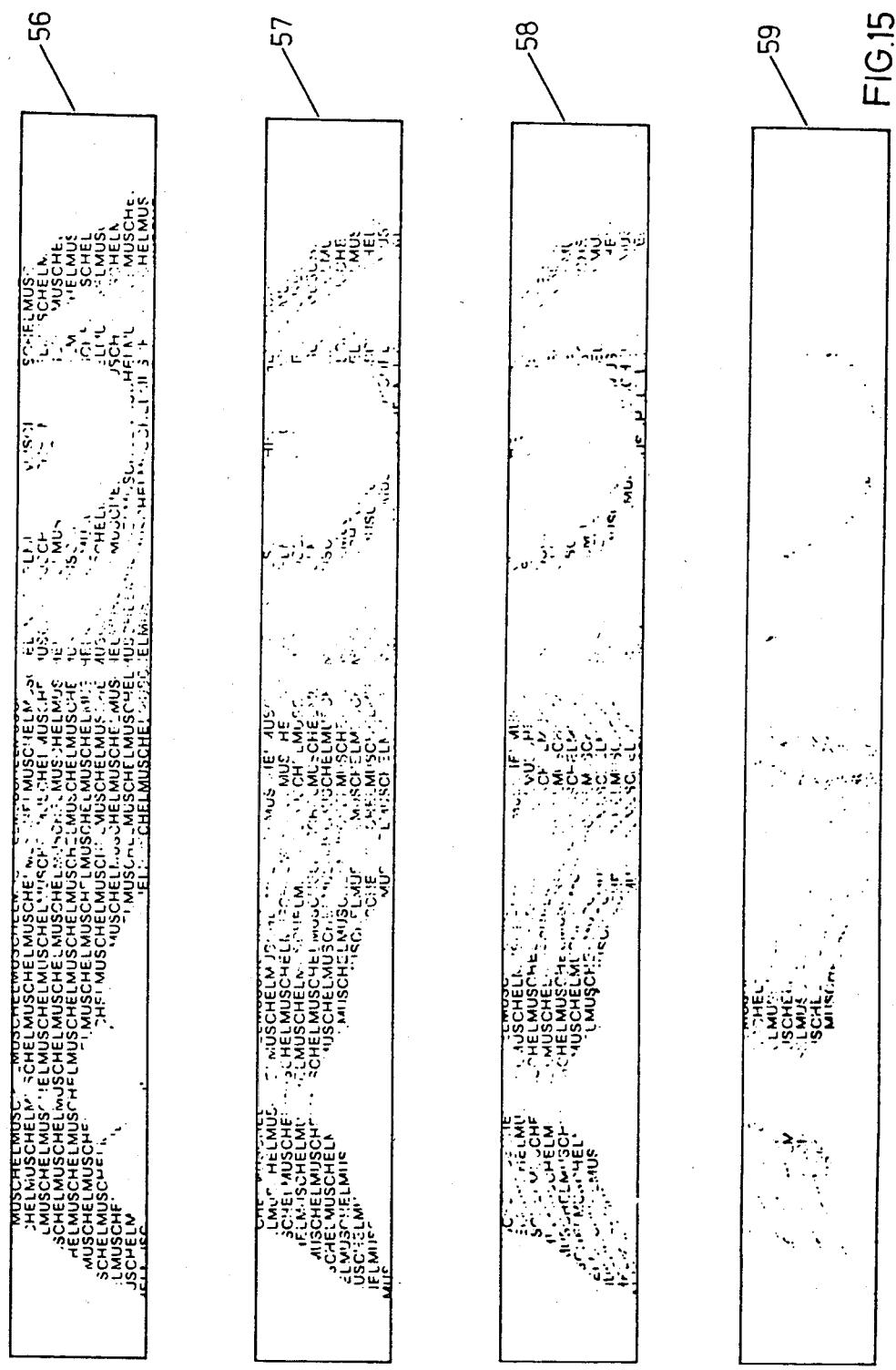

The result of this exposure process is shown as positive 56 in FIG. 15. One proceeds analogously with the further tone separations 53,54,55 of FIG. 14, i.e. of decreasing structural width, and screen positives 49,50,51 of FIG. 13, each having increasing structural width, and a new line material.

The screened tone separations 56,57,58,59 thus obtained are shown in FIG. 15, each screened tone separation reproducing the parts of the half-tone picture theme showing gray tones from the gray tone area determined by the tone separation, locally by the screen structure width assigned to the particular tone separation. These positives are copied together and then the basic screen structure 47 of FIG. 13 is copied in additionally.

FIG. 16 shows the picture theme thus obtained, which can be used as a printing original or for other purposes.

Figure 17:
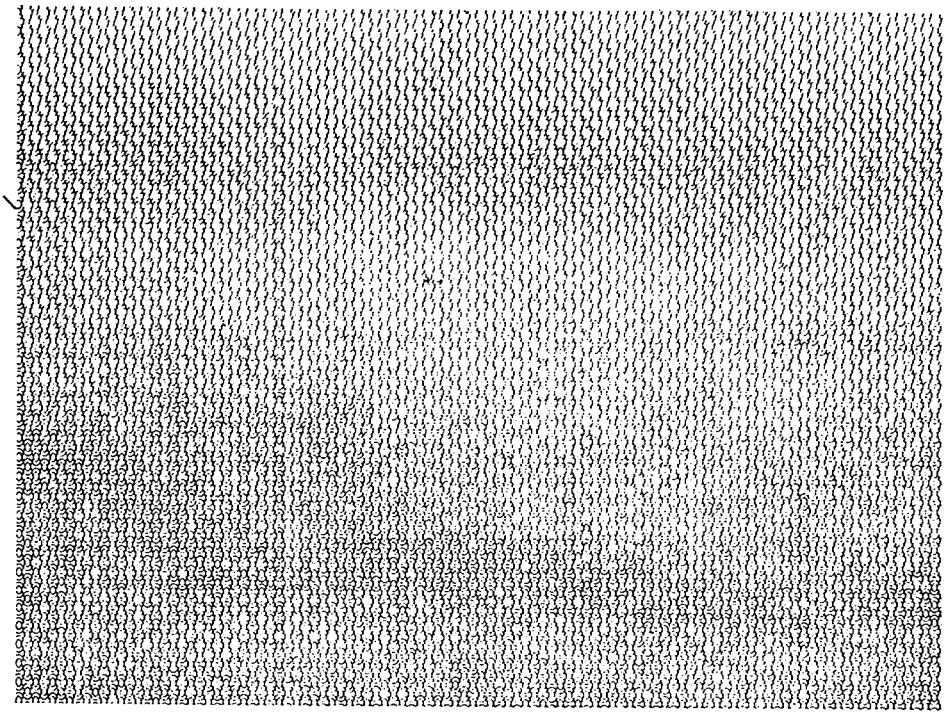
Figure 18:
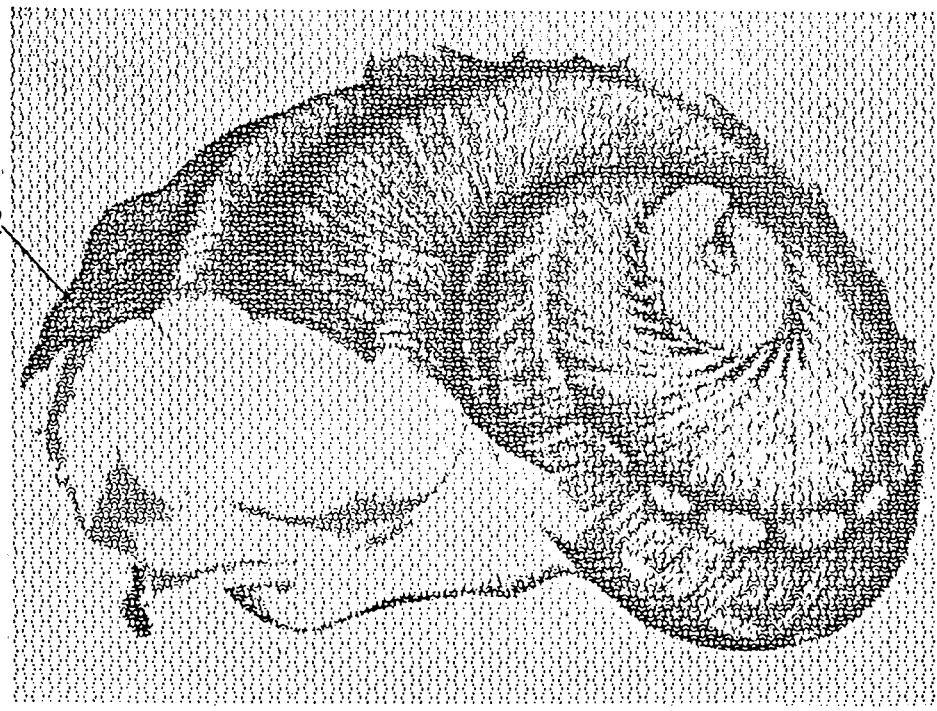

A further example of how to apply the single step method is shown in FIGS. 17 and 18. The intertwining line pattern 61 shown in FIG. 17 serves as a basic screen structure. If the above-mentioned procedural steps are carried out with this screen, the screened picture theme shown in FIG. 18 is obtained. The picture information of shell 62 is produced here by lines which become thicker or thinner in the screen structure, each of which reproduces the corresponding gray tone area of the original.

The line pattern of intertwining and criss-crossing lines used in this example (an example of a simple guilloche) finally makes the particular advantages of this method for bank-note and security paper printing properly clear, since in this case the reproduction of picture information can be controlled by thickening or thinning the line structure so that the lines do not blotch or merge at all in the darkest areas and smallest loops, and the lines of the guilloche pattern can be followed in all parts of the picture theme without interruption.

Figure 19:
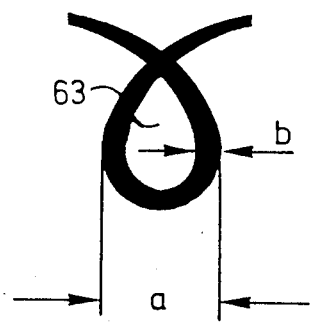
Figure 19:
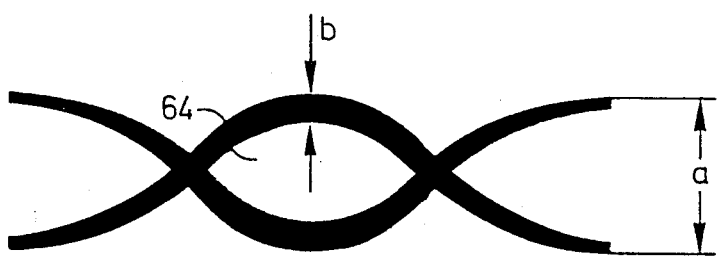
Figure 19:
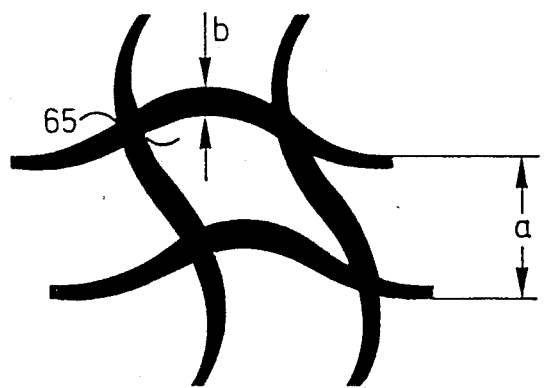

FIGS. 19a to c show some possible looping forms which may come about in security line patterns with intertwining and criss-crossing lines.

FIG. 19a shows a loop 63 which is formed by a single line, while FIG. 19b shows a loop 64 formed of two lines and FIG. 19c a loop 65 formed of four lines. The line width b and loop width a are matched in such a way that line width b is always less than half of loop width a, thus preventing blotching or merging of the lines in every case.

Figure 20:
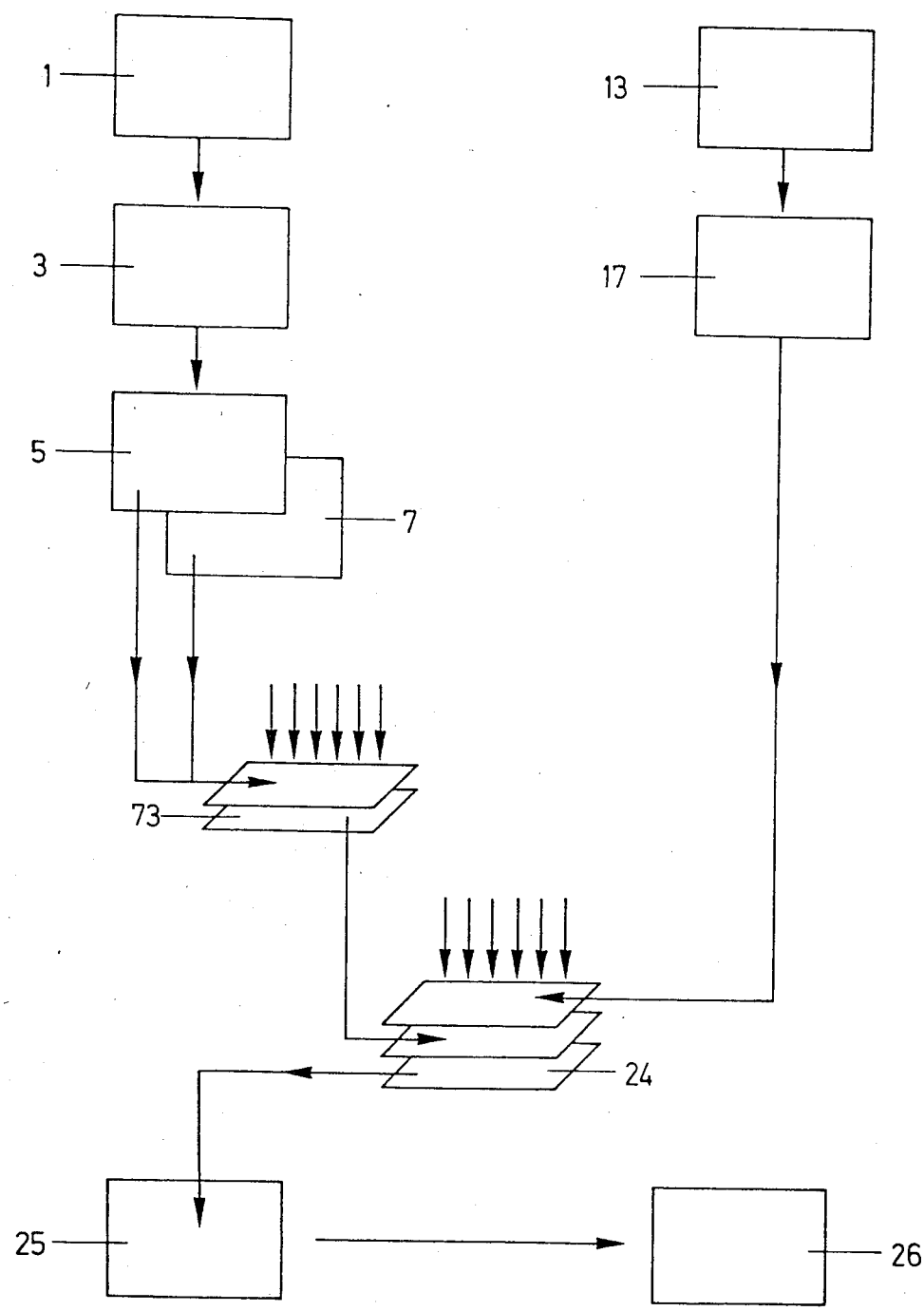
Figure 21:
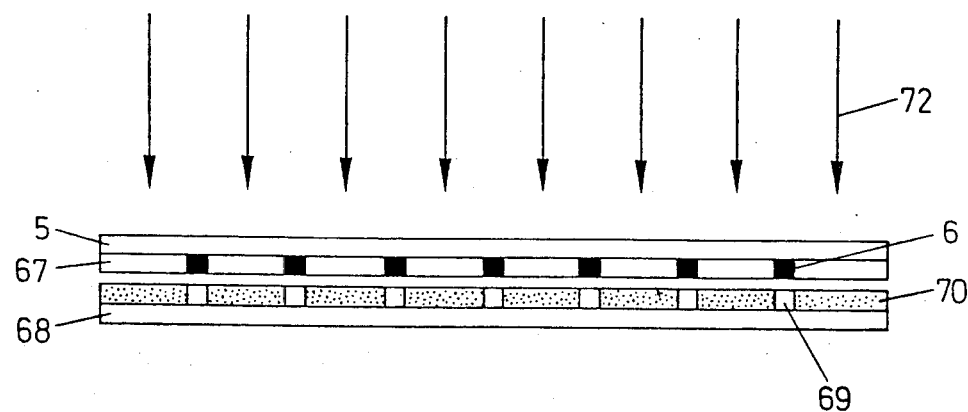

FIG. 20 shows a schematic operating plan for the photographic "contact screen half-tone method", reference being made to the same schematic figures (FIGS. 1 to 6, FIG. 9) as for the "single step half-tone method". The left-hand branch of the sequence plan (FIG. 20) shows the production sequence of the contact screen. A negative 3 (FIG. 3) is produced from positive 1 of the basic screen structure (FIG. 1). From this negative 3, lines copies 5,7 with gradually broadening screen structures (in this case, two steps) are produced as a positive film by selective irradiation, as already described in connection with the single step method. The preparation of the contact screen takes place in such a way that line copy 5 with the smallest structural width 6 is placed on an appropriate, unexposed half-tone material and exposed for a certain length of time. This exposure arrangement is shown once again in FIG. 21. The line copy 5 (FIG. 4a) with the smallest screen structure width 6 fixed in the photo emulsion layer 67 is placed in direct contact on a half-tone material 68 with its unexposed photo emulsion layer 70 and exposed with parallel light 72 for a precisely defined length of time. During the exposure process the area 69 covered by screen structure 6 is exempted from exposure, and only the rest of the area is exposed, thus acquiring a certain gray tone or blackening precisely set by the exposure time.

The analogous exposure process is now carried out with the second line copy 7 (FIG. 20), which has the next greater structural width 8 (FIG. 4b), and the same already exposed half-tone material 68 (FIG. 21), whereby attention must be paid that screen positive 5 and half-tone material 68 are precisely fitted to each other. The blackening or the gray tone in the photo emulsion layer 70 of the half-tone material 68 increases in the area not covered by the second, more greatly broadened screen structure 6 (also FIG. 4b), so that a second gray or blackening step comes about altogether in the second exposure.

Figure 2:
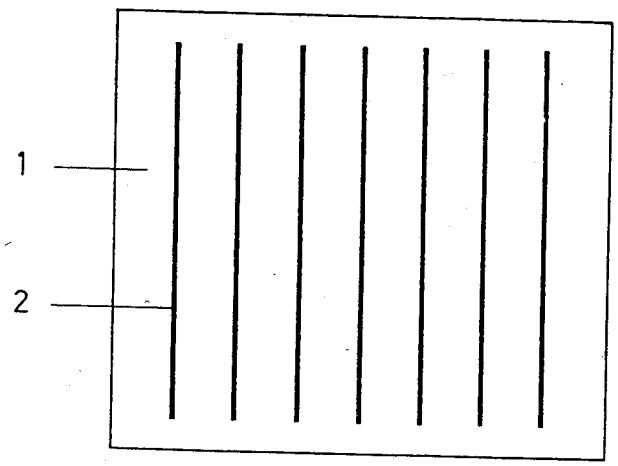
Figure 3:
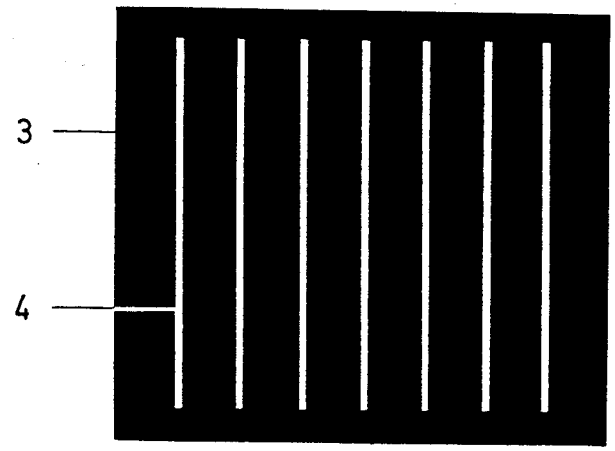
Figure 4A:
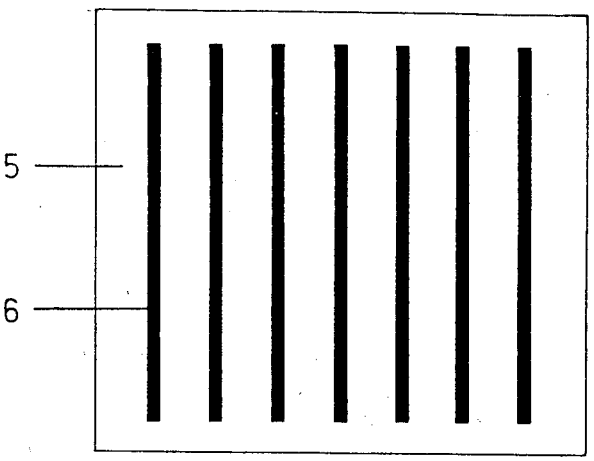
FIG. 4a shows the positive 5 which comes about during the first irradiation process, with its broadening stripes 6, i.e. with a structural width which increases relative to the basic screen structure.
Figure 4B:
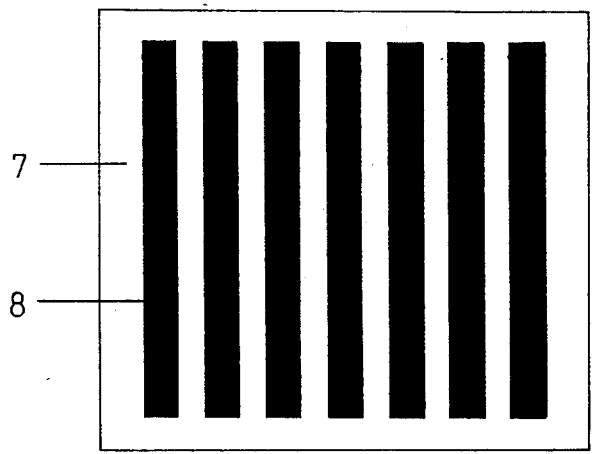
FIG. 4b shows the positive 7 which comes about during the second irradiation process, with stripes 8 which broaden even more. The degree of broadening can be selectively controlled by the exposure time.
Figure 22:
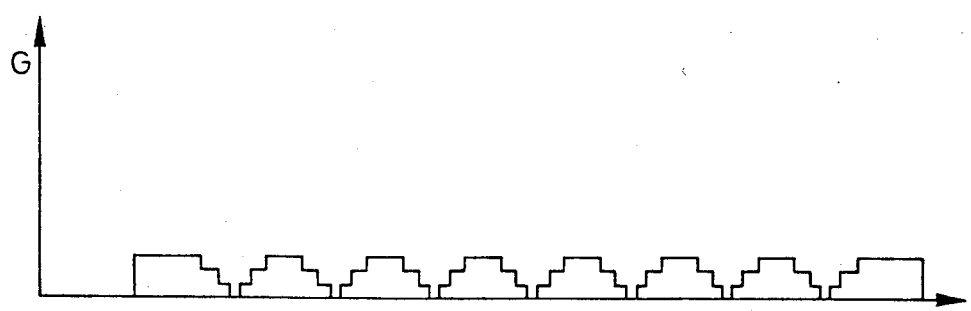

FIG. 22 shows the step-by-step gray tone or blackening progression of a contact screen, as obtained with three steps, i.e. three broadening screen structures (in this view, the positive of the basic screen structure of FIG. 2 was used as the first step). The step width, i.e. the width of the blackening or gray tone steps, is determined by the particular structural width of the broadening screen structure used, and the height of the step, i.e. the jump in the gray tone or blackening progression, is determined by the particular, freely selectable and precisely adjustable exposure time.

Using a contact screen 73 (FIG. 20) produced in this manner, the half-tone picture theme to be screened 13 (FIG. 20), from which first a negative film 17 was prepared, is screened in the classical way by placing the negative film 17 of the picture theme and the contact screen 73 on an unexposed line material 24 in a contact arrangement and exposing it until the various gray tones of the half-tone picture theme are reproduced locally by the various structural widths of the broadening screen structures assigned to each gray tone.

Which gray tone area of the half-tone original is reproduced by which structural width depends on the number and height of the steps in the contact screen and the exposure time during the screening process, and can be selectively controlled. The screened picture theme obtained in this manner can then be used to produce printing plates 25 and to print data carriers 26.

The advantage of this production method is that any structure, no matter how complicated, can be translated into a contact screen with simple photographic techniques. The half-tone reproduction of a picture theme screened with such a contact screen by means of structural elements of the basic screen structure which grow thicker or thinner and thus reproduce each half-tone can be precisely set, i.e. the number of steps can be increased at will as far as the technical possibilities allow, so that a quasi-continuous or continuous gray tone or blackening progression can be obtained, as desired. Furthermore, the half-tone reproduction can be shifted at will by the precise adjustment of the height of the steps, so that certain gray tones of the original may be put in the proper relation during screening.

A technical aid both for the single step method and for the contact screen method is macrophotography, when working with very finely structured picture themes and screens. When screening a picture theme, the picture information emerges more clearly and precisely, the narrower and finer the structure of the screen is. The more steps one uses, the better and more exactly the half-tones of the picture theme will be reproduced.

For this purpose, it is advantageous to use enlarged screen positives or negatives when working with finely structured screens and a large number of steps, i.e. several broadening screen structures, since 50 screen negatives or positives of increasing structural width, for example, may be produced from a screen as in FIG. 17 without much difficulty if ten-fold, fifteen-fold or even greater enlargement is used. If the half-tone picture theme to be screened, e.g. the shell in FIG. 12, is also enlarged accordingly and 50 tone separations of increasing structural width (i.e. tone separations reproducing 50 different gray tone areas of the half-tone original) are prepared from it, an enlarged screened printing original, which is then reduced to the desired dimensions, is obtained with the same procedural steps as depicted in the above methods.

On the other hand, if very few steps are used and the transitions in the screen structures between two steps are to be mitigated or made somewhat softer, one preferably works with greatly reduced picture themes and screen structures. The printing original which comes about in this manner is then enlarged to the desired dimensions at the end of the procedure, and shows a continuous progression in the transitional areas between the various structural widths of the screen or screen widths. This effect may be explained by the gradation curve of the line material used, as mentioned above.

Another method of obtaining a better optical preparation of the screened printing original for printing consists in reproducing the screened picture theme somewhat fuzzily on line material in a process camera before the basic screen structure or original screen structure is copied in, and only then copying in the basic screen structure. The somewhat fuzzy reproduction also has the effect of making the screen gradations in the screened picture theme softer. This method may also be applied when using a contact screen, leaving out the narrowest step in the contact screen.

Figure 23:
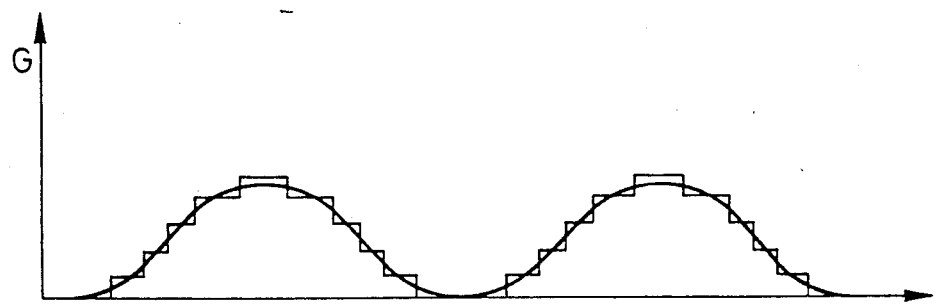
Figure 24:
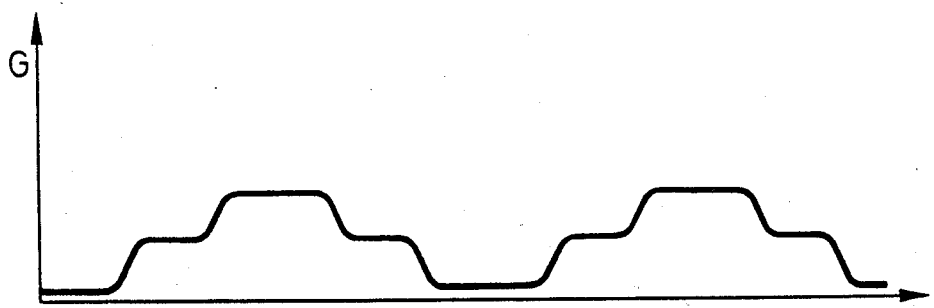

In conclusion to the photographic "contact screen half-tone method", it may be mentioned that new ways of producing classical contact screens such as dot, line or cross screens are opened up by this method, without recourse to the production of a glass half-tone screen. Thus, usual line screens or other screen structures can be produced in great numbers and with high quality by producing a multi-step contact screen, i.e. a contact screen produced with several broadening screen structures, with a very great number of steps and on an enlarged scale, reproducing this contact screen somewhat fuzzily, reducing it to the necessary dimensions and producing the desired number of duplicates from this original. It is thus possible to prepare any number of identical screens by the contact screen method, all having a quasi-continuous or continuous gray tone or blackening progression which can be precisely adjusted, in an economic manner without having to produce a glass half-tone screen along the way. This method allows not only for the gradation curve of a classical contact screen (see FIG. 23) to be approximated step-by-step to any desired degree of precision, and made almost continuous with the above-mentioned technical resources; any gray tone or blackening progression may even be obtained in the contact screen, for example the progression shown in FIG. 24, with which a half-tone picture theme can be translated into a screen image with a greatly accentuated light-dark contrast.

In the following, two "technicalized" variants of the contact screen method will be briefly sketched.

After a basic screen structure and broadening screen structures have been prepared by means of computer graphics or the scanning device, as in the "technicalized" single step methods described above—whereby the information on the position and form of the screen elements is stored separately for each broadening screen structure—, each broadening screen structure has a gray tone assigned to it which is added to the stored position and form information for the corresponding broadening screen structure.

If this information is overlaid, i.e. the assigned gray tones are added point by point for each broadening screen structure, and this resulting information is stored, an "electronic contact screen" is obtained, i.e. a screen structure whose form is stored point by point, a gray or blackening value being assigned to each point. This information can be used, for example, to control the laser beam recorder which exposes or transfers this "electronic contact screen" onto an unexposed half-tone material, so that a classical photographic contact screen is obtained.

Direct "electronic" screening is also possible, however, by scanning the half-tone original, storing its gray tones point by point and overlaying them with the stored "electronic" contact screen in such a way that the gray tones of the electronic contact screen and the half-tone original are added, and resulting information is stored when a predefined, empirically determined threshold for each point is exceeded. This resulting information (it is the "form information" of the screened picture theme) then reproduces the screened picture theme by different structural widths of the basic screen structure, which can be displayed on the display screen and/or transferred by the laser beam recorder directly onto printing plates or first onto an unexposed line material.

A slightly modified variant for producing an "electronic contact screen" consists in producing a basic screen structure as described above, the form of which is stored. A characteristic screen element is isolated from this basic screen structure and a gray tone or blackening progression is defined for this screen element (e.g. by computer graphics, by defining for various cross-sections of the characteristic screen element a blackening or gray tone progression which may also be displayed in perspective on the display screen, yielding a stereoscopic image of the blackening or gray tone progression in a screen element). This information produced for a screen element is transferred to the entire basic screen structure so that an "electronic contact screen" is obtained with which one can continue working as described above by either screening electronically or preparing a photographic contact screen.

In conclusion, the essential advantages of the inventive method should be stated once again. It is common to all variants that any desired structures can be used as a screen, and the translation of the gray tones of the original into certain structural widths of a basic screen structure can be selectively controlled in every detail. An advantage of the single step method is the possibility of attaining a certain "exclusivity" and uniqueness of the screen structures and the screening, since a picture theme screened in this manner cannot be reproduced without precise knowledge of the production recipe (i.e. the degree of broadening of the basic screen structure, the exact pattern of the basic screen structure, the assignment of a broadening screen structure to a gray tone area of the half-tone original to be screened, etc.). New possibilities are also provided for bank-note and security paper printing, since for the first time a picture theme can be reproduced by a security line pattern as complicated as one wishes. Thus it is possible, for example, when using concentric guilloches, to reproduce the picture information through the central area of the security line pattern, even in several colors, and have it run into simple guilloche lines without picture information. The path of the guilloche lines could be pursued without interruption even through the picture theme. Attempted forgery and imitation is considerably obstructed by this integration of picture information into the security line pattern.

A special possibility of great interest for printing and security techniques which emerges from the above methods of printing data carriers, especially security paper, consists in transferring the various screened gray tone areas of the half-tone picture theme onto two different printing plates (e.g. by directly engraving the printing plates by means of the EDP-controlled laser beam recorder or by the above-mentioned techniques), one printing plate being used to print the front of the data carrier and the other printing plate being used to print the back. Part of the picture information (an overlay of selected screened gray tone areas) is then found on the front; the other part of the picture information (the rest of the overlaid and screened gray tone areas) on the back, so that the complete screened picture information becomes visible by transmitted light. For this purpose, of course, the screened part of the picture intended for the back of the data carrier must be transferred onto the printing plate in a laterally reversed form, and attention must be paid that the two parts are identically matched when printing the data carrier.

A particular advantage of the photographic methods is that they can be realized with relatively simple technical means and still yield results which are inconceivable with classical screening techniques.

Leaving the elaborate apparatus for the "technicalized" methods out of consideration, they are particularly well-suited for trying out novel screen forms with any gray tone or blackening progression at all, since all parameters can be immediately varied and the effects of this variation displayed almost simultaneously on a display screen, so that exclusive "screen desires" may also be fulfilled, both in terms of the production of contact screens and in terms of the direct electronic screening, the production of printing plates or printing originals.

We claim:

1. A method of screening half-tone picture themes, the various half-tones or gray tones of the picture theme being reproduced by greater or smaller changes in the structural width of a basic screen structure, characterized in that
   (a) a freely selectable change, which is characteristic for the relevant gray tone, in the structural width of a basic screen structure having any desired form is assigned to each or only some of the gray tones of the half-tone picture theme,
   (b) for each gray tone selected under (a), the parts of the half-tone picture theme showing this gray tone are translated into the change in the structural width. of the basic screen structure assigned to this gray tone, by overlaying the relevant parts of the half-tone picture theme singly or collectively on the changed structural widths of the basic screen structure, which may also be present singly or collectively.

2. A method as in claim 1, characterized in that
   (a) the entire gray tone progression of the half-tone picture theme is divided up into gray tone areas, the limits of which on the gray tone scale are freely definable,
   (b) gradually broadening basic screen structures are produced from a basic screen structure having any desired form, the broadening of the structural width of the basic screen structure being freely selectable for each broadened screen structure,
   (c) a certain broadening screen structure of those produced under (b) is assigned to each or only some of the gray tone areas defined under (a),
   (d) the broadening screen structures are superimposed singly, consecutively or collectively on the gray tone areas of the half-tone picture theme assigned to them under (c), which may also be present singly or collectively, and
   (e) the parts of the half-tone picture theme having a gray tone in one of the gray tone areas selected under (c) are reproduced locally by the broadening screen structure assigned to this gray tone area.

3. A method as in claim 2, characterized in that
   (a) broadening screen structures in the form of line copies of increasing structural width, existing as negative or positive film, are produced from the basic screen structure, these broadening screen structures acting as a black and white screen with a gradual gray tone progression,
   (b) the same number of tone separations is produced in the form of negative or positive film from the half-tone picture theme to be screened, each of which reproduces a certain gray tone area of the half-tone picture theme,
   (c) the line copy with the greatest structural width of the screen, existing as a negative or positive film, is placed on an unexposed line material in a contact arrangement, along with the tone separation with the smallest structural width existing as a negative or positive film and reproducing the parts of the half-tone picture theme with the darkest gray tones,
   (d) this arrangement is exposed until complete blackening occurs in the areas of the line material where the arrangement is completely pervious to light, so that the gray tone area of the half-tone picture theme defined by the tone separation is reproduced by the screen with the smallest structural width, (e) one proceeds analogously with the line copies each decreasing in structural width, the tone separations each increasing in structural width and a new unexposed line material each time, (f) the line materials present in the form of positive or negative film, each of which reproduces a different gray tone area of the half-tone picture theme by a different structural width of the basic screen structure, are used to produce an overall screened picture theme.

4. A method as in claim 2, characterized in that (a) broadening screen structures are produced from the basic screen structure in the form of line copies of increasing structural width existing as negative or positive film and acting as a black and white screen with a gradual gray tone progression, (b) the line copy with the smallest structural width existing as a negative or positive film is placed on an unexposed line material in a contact arrangement, along with a negative or positive film of the half-tone picture theme to be screened, (c) this arrangement is exposed until a certain gray tone range of the half-tone picture theme to be screened is reproduced by the smallest screen structure in the areas of the line material where the arrangement transmits enough light to cause blackening of the line material, (d) one proceeds similarly with the line copy of the next largest structural width and a new unexposed line material, the duration of exposure being increased in such a way that an accordingly greater gray tone range of the half-tone picture theme is translated into this wider structure, (e) this procedure is carried out analogously for each further line copy of increasing structural width, (f) the line materials present in the form of positive or negative film, each of which reproduces a different gray tone area of the half-tone picture theme by a different structural width of the basic screen structure, are used to produce an overall screened picture theme.

5. A method as in claim 3 or 4, characterized in that the number of the line copies with increasing structural width is such that there is continuous gray tone translation of the half-tone picture theme into continuously increasing structural widths of the basic screen structure.

6. A method as in claim 3 or 4, characterized in that the assignment of a gray tone area to a screen structure width takes place in such a way that the gray tone areas of the half-tone picture theme are translated into nonproportional broadening of the structural width of the basic screen structure, so that the screened picture theme has a shift of gray tones relative to the half-tone picture theme.

7. A method as in claim 2, characterized in that (a) broadening screen structures are produced from the basic screen structure in the form of line copies with increasing structural width existing as negative or positive film and acting as a black and white screen with a gradual gray tone progression, (b) each of these line copies is placed singly on an appropriate unexposed half-tone material and exposed for a certain length of time, the final result being a positive or negative contact screen having a blackening progression of the screen profile which can be precisely adjusted and is defined by the basic screen structure and the exposure times, (c) this positive or negative contact screen is used to produce an overall screened picture theme.

8. A method as in any of claims 3 to 7, characterized in that the line copies with increasing structural width are produced photographically by selectively irradiating a new line material each time.

9. A method as in any of claims 3 to 7, characterized in that the basic screen structure and the broadening screen structures are produced by computer graphic techniques and transferred onto a new line material each time by means of a controlled laser beam recorder.

10. A method as in claim 3, characterized in that the tone separations are produced photographically.

11. A method as in claim 3, characterized in that the tone separations are obtained by a scanning device and are transferred onto a new line material each time by means of a controlled laser beam recorder.

12. A method as in any of claims 3 to 7, characterized in that the basic screen structure is copied into the picture, fitting precisely, after the half-tone picture theme has been screened.

13. A method as in any of claims 3 to 12, characterized in that the various steps of the method are carried out with basic structures, line copies or half-tone picture motives which are either enlarged or reduced relative to the original.

14. The use of screened parts of the picture theme according to the method as in any of claims 1 to 13 for the production of printing originals, printing plates or data carriers with the picture theme printed on.

15. A method as in claim 1, characterized in that (a) the basic screen structure and the broadening screen structures are produced by means of computer graphic techniques or by scanning photographic or graphic originals, (b) the position and form of the screen elements are stored separately for the basic screen structure and the broadening screen structures, (c) the gray tone range of the half-tone picture theme is divided up into gray tone areas and the half-tone picture theme is scanned in such a way that the parts of the half-tone picture theme having a gray tone in one of these areas are stored separately for each gray tone area, (d) all or some of the gray tone areas are assigned to one broadening screen structure width each, (e) the information is overlaid point by point and separately for each gray tone area for a broadening screen structure and an assigned gray tone part of the half-tone picture theme, in such a way that resulting information is formed and stored saying whether the screen structure and picture part are present at this point, so that each gray tone part of the picture theme is reproduced by the assigned screen structure, (f) this information on the various screened gray tone parts of the half-tone picture theme is used to produce a screened picture theme.

16. A method as in claim 15, characterized in that a laser beam recorder is controlled separately for each gray tone area with the information on the screened gray tone parts of the half-tone picture theme, and exposes the screened gray tone parts onto separate film layers for each one or transfers them directly onto printing plates.

17. A method as in claim 15, characterized in that the various screened gray tone parts are first overlaid and then exposed onto a film layer or transferred onto a printing plate.

18. A method as in claim 1, characterized in that
  (a) the basic screen structure and the broadening screen structures are produced by computer graphic techniques or by scanning photographic or graphic originals,
  (b) the position and form of the screen elements of the basic screen structure and the broadening screen structures are stored separately,
  (c) a gray tone is assigned to each broadening screen structure and added to the information on the position and form of the broadening screen structure,
  (d) this information on the broadening screen structures is overlaid in such a way that the gray tones are added point by point so that a gray tone is assigned to each point of the resulting screen structure, and this information is stored, yielding an "electronic contact screen",
  (e) a half-tone original is scanned in such a way that the gray tone is stored for each point,
  (f) the information on the gray tones of the half-tone picture theme is overlaid with the information of the "electronic contact screen" in such a way that the gray tones are added for each point of this overlaid arrangement, and when a threshold value for this point is exceeded, positive information is stored so that this resulting information reproduces the screened picture theme.

19. A method as in claim 1, characterized in that
  (a) a basic screen structure is produced by computer graphic techniques or scanning photographic or graphic originals.

20. A method as in either of claims 18 or 19, characterized in that the stored information on the screened half-tone picture theme is used to control a laser beam recorder which transfers the picture theme onto a film layer, photo paper, a printing plate or a carrier material.

21. A method of producing a film contact screen, characterized in that
  (a) broadening screen structures are produced from a basic screen structure in the form of line copies with increasing structural width existing as negative or positive film and acting as a black and white screen with a gradual gray tone progression,
  (b) each of these line copies is placed singly on an appropriate unexposed half-tone material in a contact arrangement and exposed for a certain length of time, yielding as the final result a positive or negative contact screen with a blackening pattern of the screen profile which is precisely adjustable and determined by the basic screen structure and the exposure times.

22. A method of producing a film contact screen, characterized in that
  (a) a basic screen structure and the broadening screen structures are produced by computer graphic techniques or by scanning photographic or graphic originals,
  (b) the position and form of the screen elements of the basic screen structure and the broadening screen structures are stored separately,
  (c) a gray tone is assigned to each broadening screen structure and added to the information on the position and form of the broadening screen structure,
  (d) this information is overlaid on the broadening screen structures in such a way that the gray tones are added point by point, so that a gray tone is assigned to each point of the resulting screen structure and this information is stored, yielding an "electronic contact screen", and
  (e) this information is used to control a laser beam recorder which transfers the "electronic contact screen" onto a half-tone material.

23. A method of producing a film contact screen, characterized in that
  (a) a basic screen structure is produced by computer graphic techniques or scanning photographic or graphic originals,
  (b) the position and form of the screen elements of the basic screen structure are stored,
  (c) a gray tone or blackening progression is defined and stored for one or more cross-sections of a characteristic screen element by means of computer graphic techniques,
  (d) this gray tone progression is transferred onto the entire basic screen structure, and stored, yielding an "electronic contact screen",
  (e) this information is used to control a laser beam recorder which transfers this electronic contact screen onto a half-tone material.

* * * * *